US010749502B2

(12) United States Patent
Zivkovic et al.

(10) Patent No.: US 10,749,502 B2
(45) Date of Patent: Aug. 18, 2020

(54) APPARATUS AND METHOD FOR PERFORMING HORIZONTAL FILTER OPERATIONS

(71) Applicant: Intel Corporation, Santa Clara, CA (US)

(72) Inventors: Zoran Zivkovic, 's-Hertogenbosch (NL); Edwin Van Dalen, Eindhoven (NL)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 15/721,555

(22) Filed: Sep. 29, 2017

(65) Prior Publication Data
US 2019/0103857 A1    Apr. 4, 2019

(51) Int. Cl.
| | |
|---|---|
| *H03H 17/06* | (2006.01) |
| *G06F 17/15* | (2006.01) |
| *G06F 9/30* | (2018.01) |
| *G06F 9/38* | (2018.01) |
| *H03H 17/00* | (2006.01) |
| *H03H 17/02* | (2006.01) |

(52) U.S. Cl.
CPC .......... *H03H 17/06* (2013.01); *G06F 9/3001* (2013.01); *G06F 9/30036* (2013.01); *G06F 9/3895* (2013.01); *G06F 17/15* (2013.01); *H03H 2017/0081* (2013.01); *H03H 2017/0298* (2013.01)

(58) Field of Classification Search
CPC ...... G06F 9/30036; H03H 17/06–0607; H03H 17/0294; H03H 21/0012; H03H 2017/0072
See application file for complete search history.

(56) References Cited

U.S. PATENT DOCUMENTS

| | | | | |
|---|---|---|---|---|
| 6,385,634 B1 * | 5/2002 | Peleg | .................... | G06F 7/4812 |
| | | | | 708/490 |
| 6,675,286 B1 * | 1/2004 | Sun | ..................... | G06F 9/30014 |
| | | | | 708/603 |
| 9,898,286 B2 * | 2/2018 | Van Dalen | ............ | G06F 9/3001 |

(Continued)

*Primary Examiner* — Matthew D Sandifer
(74) *Attorney, Agent, or Firm* — Nicholson De Vos Webster & Elliott LLP

(57) ABSTRACT

An apparatus and method for performing FIR filtering and blending operations. A processor comprising: a decode unit to decode a packed N-tap finite impulse response (FIR) filter instruction, the packed N-tap FIR filter instruction to indicate one or more source packed data operands comprising a plurality of packed data elements, at least 3 filter coefficients, and a destination storage location, the plurality of packed data elements comprising data from a signal to be filtered and the plurality of filter coefficients specifying a filter function to be applied; and an execution unit comprising an FIR unit coupled with the decode unit, the FIR unit, in response to the packed N-tap FIR filter instruction being decoded by the decode unit, to perform at least N−1 multiplications to generate at least N−1 products, each of the multiplications comprising one of the filter coefficients multiplied by one of the packed data elements, the execution unit to combine the at least N−1 products in accordance with a specified type of FIR filter being implemented to generate a result packed data element to be stored in the destination storage location.

42 Claims, 27 Drawing Sheets

(56) References Cited

U.S. PATENT DOCUMENTS

| | | | | |
|---|---|---|---|---|
| 2007/0208793 A1* | 9/2007 | Koyanagi | ............. | H03H 17/06 |
| | | | | 708/300 |
| 2008/0059760 A1* | 3/2008 | Sachs | ................. | G06F 9/30014 |
| | | | | 712/7 |
| 2008/0071851 A1* | 3/2008 | Zohar | ................... | G06F 7/5443 |
| | | | | 708/626 |
| 2010/0274990 A1* | 10/2010 | Wilder | ................. | G06F 9/3001 |
| | | | | 712/22 |
| 2014/0189231 A1* | 7/2014 | Maydan | ............. | G06F 9/30036 |
| | | | | 711/110 |
| 2016/0328233 A1* | 11/2016 | Van Dalen | ........... | G06F 9/3001 |

\* cited by examiner

FIG. 8

| OPCODE 870 | FIRST SOURCE SPECIFICATION FIELD 871 | SECOND SOURCE SPECIFICATION FIELD 872 (OPTIONAL) | DESTINATION SPECIFICATION FIELD 873 (OPTIONAL) | IMMEDIATE 874 (OPTIONAL) | THIRD SOURCE SPECIFICATION FIELD 875 (OPTIONAL) |
|---|---|---|---|---|---|

VECTOR FIR FILTER INSTRUCTION 822

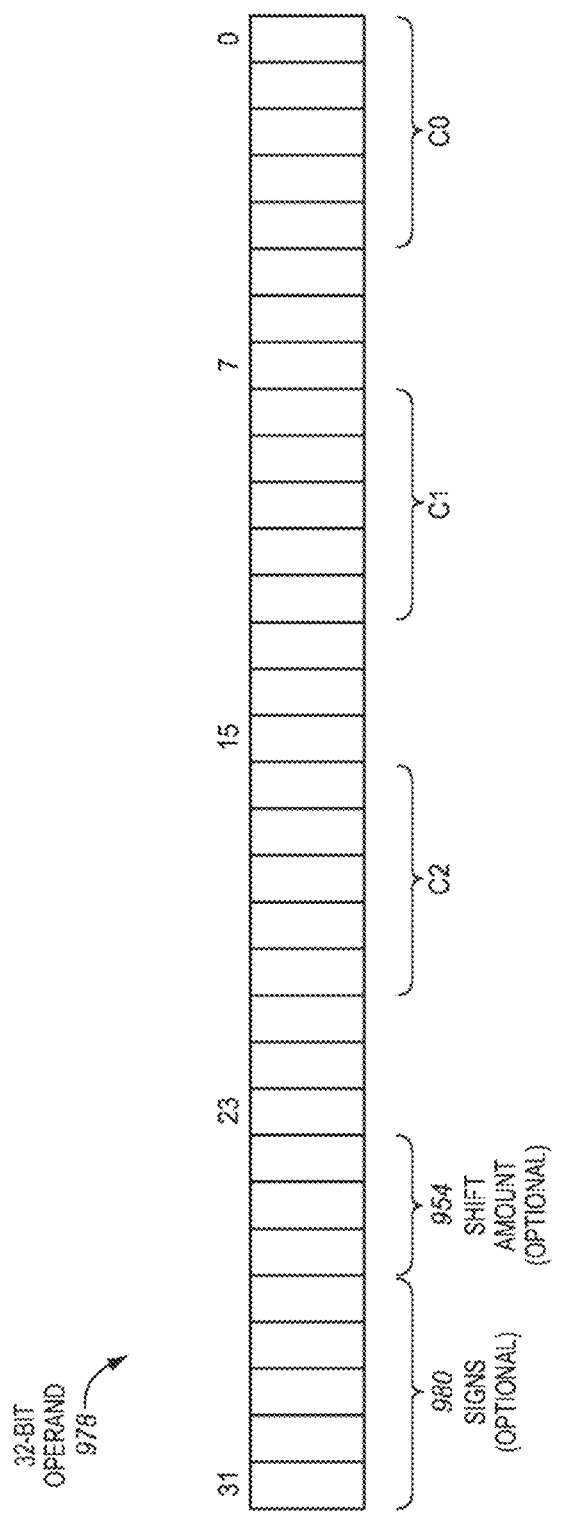

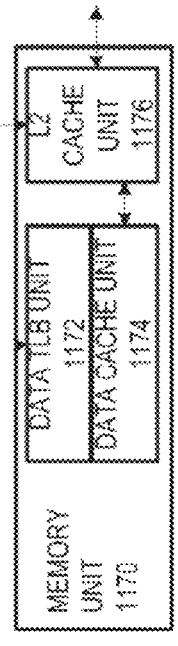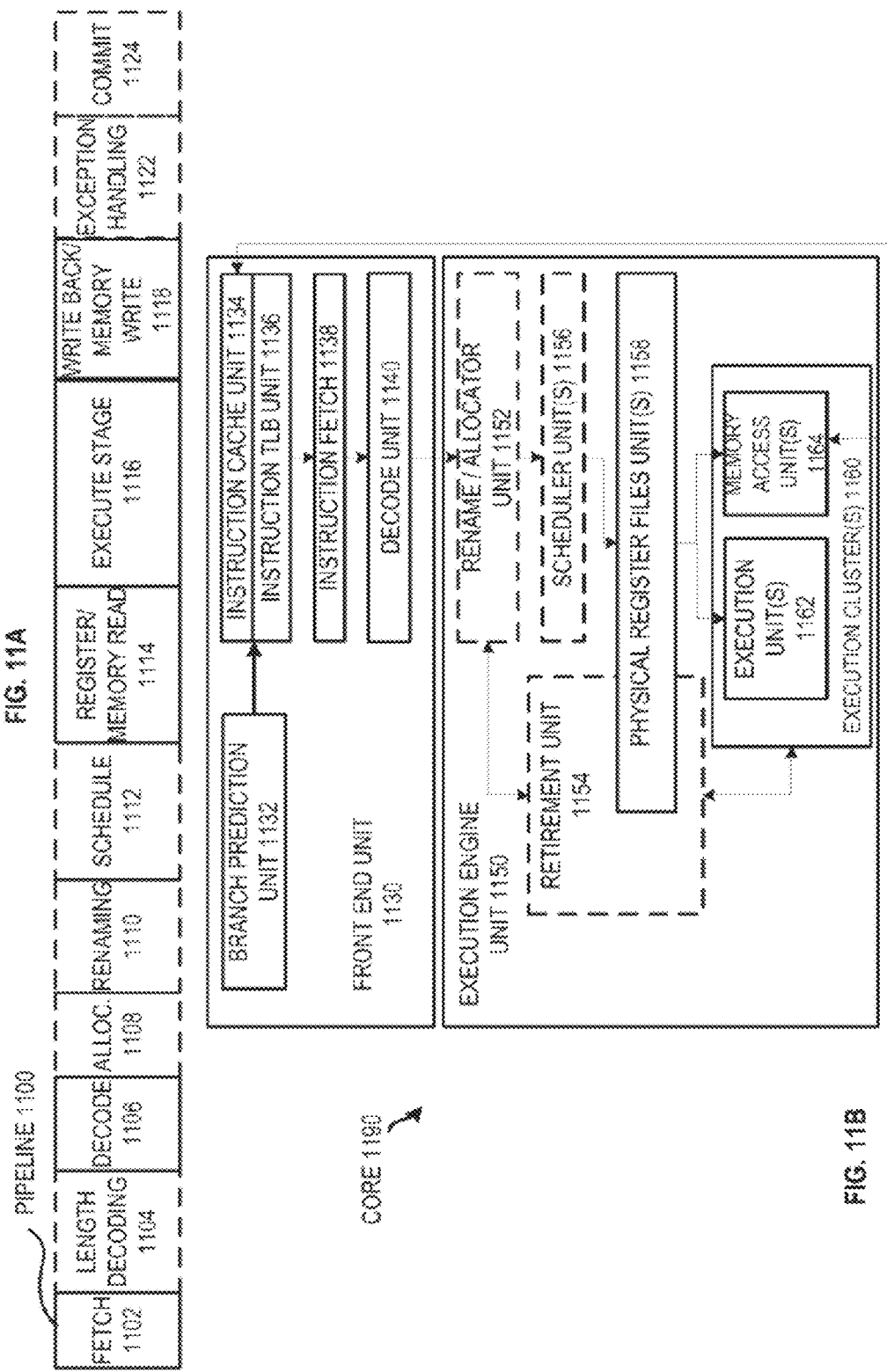

|   | b | 0 | 1 | 2 | 3 | 4 | 5 | 6 | 7 |
|---|---|---|---|---|---|---|---|---|---|
| row 0 | | 0 | 1 | 2 | 3 | 4 | 5 | 6 | 7 |
| row 1 | | 8 | 9 | 10 | 11 | 12 | 13 | 14 | 15 |
| row 2 | | 16 | 17 | 18 | 19 | 20 | 21 | 22 | 23 |
| row 3 | | 24 | 25 | 26 | 27 | 28 | 29 | 30 | 31 |
|   | a | 0 | 1 | 2 | 3 | 4 | 5 | 6 | 7 |
|   | | 8 | 9 | 10 | 11 | 12 | 13 | 14 | 15 |
|   | | 16 | 17 | 18 | 19 | 20 | 21 | 22 | 23 |
|   | | 24 | 25 | 26 | 27 | 28 | 29 | 30 | 31 |

*Fig. 24*

|  | from a | | | | | | | | from b | | | | | | | |
|---|---|---|---|---|---|---|---|---|---|---|---|---|---|---|---|---|
| horizontal fir row 0 | 4 | 5 | 6 | 7 | 0 | 1 | 2 | 3 | 4 | 5 | 6 | 7 | | | | |
| horizontal fir row 1 | 12 | 13 | 14 | 15 | 8 | 9 | 10 | 11 | 12 | 13 | 14 | 15 | | | | |
| horizontal fir row 2 | 20 | 21 | 22 | 23 | 16 | 17 | 18 | 19 | 20 | 21 | 22 | 23 | | | | |
| horizontal fir row 3 | 28 | 29 | 30 | 31 | 24 | 25 | 26 | 27 | 28 | 29 | 30 | 31 | | | | |

APPARATUS AND METHOD FOR PERFORMING HORIZONTAL FILTER OPERATIONS

BACKGROUND

Field of the Invention

The embodiments of the invention relate generally to the field of computer processors. More particularly, the embodiments relate to an apparatus and method for performing horizontal filter operations.

Description of the Related Art

1. Processor Microarchitectures

An instruction set, or instruction set architecture (ISA), is the part of the computer architecture related to programming, including the native data types, instructions, register architecture, addressing modes, memory architecture, interrupt and exception handling, and external input and output (I/O). It should be noted that the term "instruction" generally refers herein to macro-instructions—that is instructions that are provided to the processor for execution—as opposed to micro-instructions or micro-ops—that is the result of a processor's decoder decoding macro-instructions. The micro-instructions or micro-ops can be configured to instruct an execution unit on the processor to perform operations to implement the logic associated with the macroinstruction.

The ISA is distinguished from the microarchitecture, which is the set of processor design techniques used to implement the instruction set. Processors with different microarchitectures can share a common instruction set. For example, Intel® Pentium 4 processors, Intel® Core™ processors, and processors from Advanced Micro Devices, Inc. of Sunnyvale Calif. implement nearly identical versions of the x86 instruction set (with some extensions that have been added with newer versions), but have different internal designs. For example, the same register architecture of the ISA may be implemented in different ways in different microarchitectures using well-known techniques, including dedicated physical registers, one or more dynamically allocated physical registers using a register renaming mechanism (e.g., the use of a Register Alias Table (RAT), a Reorder Buffer (ROB) and a retirement register file). Unless otherwise specified, the phrases register architecture, register file, and register are used herein to refer to that which is visible to the software/programmer and the manner in which instructions specify registers. Where a distinction is required, the adjective "logical," "architectural," or "software visible" will be used to indicate registers/files in the register architecture, while different adjectives will be used to designate registers in a given microarchitecture (e.g., physical register, reorder buffer, retirement register, register pool).

2. Filtering

Filters are commonly used in data or signal processing. The filters may be used to alter the data or signal, generally by removing an unwanted component or portion of the data or signal, for example to improve the quality of the data or signal, remove noise or interfering components, enhance or bring out certain attributes of the data or signal, or the like.

Infinite impulse response (IIR) filters have an impulse response that does not necessarily become exactly zero over a finite period of time, but rather may continue indefinitely, although often decaying or diminishing. Commonly, this is due in part to the IIR filters having internal feedback that allows the IIR filters to "remember" prior results, which may lead to long impulse responses, or potentially error or signal compounding.

Finite impulse response (FIR) filters are characterized by impulse responses to finite length inputs which are of finite duration and that settle to zero in finite time. In other words, FIR filters have a bounded output for a bounded input. Convolutions and finite impulse response (FIR) filters are essential part for image processing and deep learning. In deep learning convolutions are the main processing workload and are typically performed on massively parallel hardware such as a GPU or a dedicated convolution accelerator using the 'GEMM' (generalized matrix multiplication) and 'im2col' transformations.

When the convolutions are just a part of a more complex algorithm they are often performed on a general purpose processor or a digital signal processor (DSP). Single-instruction multiple-data (SIMD) processing may then be used to speed up the computation where a convolution is performed in three steps: data alignment, multiplication and result accumulation. Dedicated instructions to merge these three steps efficiently are highly valuable to increase the processing speed on DSPs or CPUs.

BRIEF DESCRIPTION OF THE DRAWINGS

A better understanding of the present invention can be obtained from the following detailed description in conjunction with the following drawings, in which:

FIG. 8 is a block diagram of an embodiment of an example embodiment of a packed FIR filter instruction;

FIG. 9 is a block diagram of an example embodiment of a 32-bit operand that provides three FIR filter coefficients, an optional shift amount, and an optional set of sign inversion controls;

FIG. 11A is a block diagram illustrating an embodiment of an in-order pipeline and an embodiment of a register renaming out-of-order issue/execution pipeline;

FIG. 11B is a block diagram of an embodiment of processor core including a front end unit coupled to an execution engine unit and both coupled to a memory unit;

FIG. 24 illustrates vectors which are 32 elements wide and having blocks of data in 4×8 form;

FIG. 25 illustrates an embodiment in which the filter is split into four separate horizontal filters per row;

FIG. 26 illustrates another example of two sets of vector values; and

FIG. 27 illustrates splitting of the vector data into eight vertical columns for FIR filters.

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Disclosed herein are packed finite impulse response (FIR) filter instructions, processors to execute the instructions, methods performed by the processors when processing, executing, or performing the instructions, and systems incorporating one or more processors to process, execute, or perform the instructions. In the following description, numerous specific details are set forth (e.g., specific instruction operations, types of filters, filter arrangements, data formats, processor configurations, microarchitectural details, sequences of operations, etc.). However, embodiments may be practiced without these specific details. In other instances, well-known circuits, structures and techniques have not been shown in detail to avoid obscuring the understanding of the description.

Figure 1:
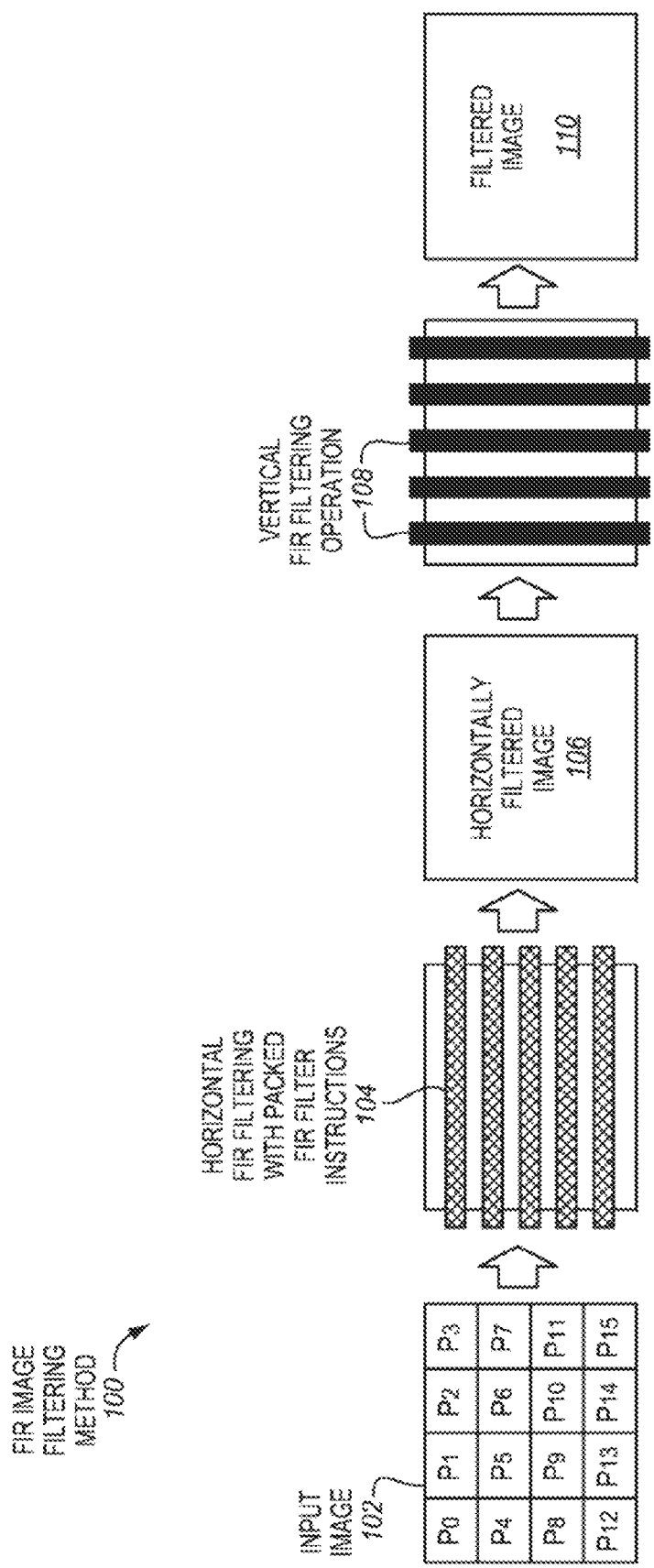
FIG. 1 is a block diagram of an embodiment of FIR image filtering method in which packed FIR filter instructions may be used.

FIG. 1 is a block diagram of an embodiment of an FIR image filtering method 100 in which packed FIR filter instructions may be used. FIR filtering is commonly used in image processing to remove noise, sharpen images, smooth images, deblur images, improve the visual quality of the images, or otherwise change the appearance of the images.

An input digital image 102 includes an array of pixels (P). The pixels are arranged in rows of pixels and columns of pixels. In this simple example, the input image has sixteen pixels P0 through P15, which are arranged in four rows and four columns. In the case of a black and white image, each pixel may represent a greyscale value. In the case of a color image, each pixel may represent a set of color components (e.g., red, green and blue (RGB) color components, cyan, magenta, and yellow (CNY) color components, or the like). In some cases, the pixels may also include one or more additional components, such as, for example, an alpha channel to convey opacity. By way of example, each of the color and/or other components of the pixel may be represented by an 8-bit, 16-bit, or 32-bit value. Other sizes are also suitable.

Many higher dimensional filtering tasks can be factorized, separated, or otherwise reduced to lower-dimensional filtering tasks. Often FIR image filtering is a two-dimensional (2D) process. However, commonly the 2D FIR image filtering can be factorized, separated, or reduced into two one-dimensional (1 D) FIR image filtering operations, namely a horizontal FIR image filtering operation, and a vertical FIR image filtering operation. The lower-order filter tasks can be performed in any order (e.g., the horizontal and vertical FIR image filtering operations may occur in either order). As shown, a horizontal FIR image filtering operation 104 may be performed first to generate a horizontally filtered image 106, and then a vertical FIR image filtering operation 108 may be performed on the horizontally filtered image 106 to generate a vertically and horizontally filtered image 110. The horizontal image FIR filtering operation may filter an input horizontal sequence pixels (e.g., from a row of pixels). Conversely, the vertical FIR image filtering operation may filter an input vertical sequence of pixels (e.g., from a column of pixels). Alternatively, in another embodiment, a vertical image filtering operation may be performed first to generate a vertically filtered image, and then a horizontal image filtering operation may be performed on the vertically filtered image. For simplicity in the illustration, only a single horizontal and a single vertical image filtering operation are shown, although it is also possible to have multiple horizontal and vertical filtering operations, which may be performed in various orders (e.g., horizontal #1, vertical #1, vertical #2, horizontal #2).

As shown, in some embodiments, packed FIR filter instructions as disclosed herein may be used during the horizontal FIR image filtering operation 104. Alternatively, packed FIR filter instructions as disclosed herein may be used during the vertical FIR image filtering operation 108. Performing the horizontal image filtering operation in a packed, vector, or SIMD processor, in which a packed data operands worth of pixels are filtered in parallel, may otherwise (i.e., without the packed FIR filter instructions disclosed herein) tend to be less efficient to implement as compared to a vertical FIR image filtering operation. One contributing reason for this is that the input image 102 is generally stored in memory in a row-major order instead of a column-major order, and the filtering is performed in the direction of the vector. When horizontally filtering images stored in row-major order (or when otherwise filtering in the direction of the vector and/or the data storage order in memory), at least for certain FIR filters, in order to filter a source packed data operands worth of pixels in parallel, not only are all of the pixels of the source packed data operand used, but also additional neighboring previous pixels may be used. Representatively, an FIR filter of a given filter order may use all of the pixels of the source packed data operand, plus the filter-order number of additional neighboring pixels. The filter order is also related to the number of taps (NTAPS) of the filter. Specifically, the filter order is equal to one less than the number of taps (i.e., NTAPS−1). For example, a fourth-order filter has five taps.

Accordingly, an FIR filter with a number of taps (NTAPS) may use all of the pixels of the source packed data operand, plus (NTAPS−1) additional neighboring pixels. For example, in order to generate an FIR filtered pixel for each corresponding pixel in the source packed data operand for a fourth-order (e.g., five tap) FIR filter, all the pixels of the source packed data operand may be used as well as four additional neighboring pixels. Without the additional neighboring pixels not all of the pixels of the source packed data operand can be filtered and/or not all of the corresponding result FIR filtered pixels can be generated. Without the packed FIR filter instructions disclosed herein, such filtering in the direction of the vector and/or the data storage order in memory may tend to be expensive, for example, due to a need to repeatedly align data. Advantageously, the packed FIR filter instructions disclosed herein may help to eliminate many such data alignments and thereby improve overall performance. In other embodiments, the packed FIR filter instructions disclosed herein may be used for vertical image filtering (e.g., which may be even more useful if the images being filtered are stored in memory in column-major order). Accordingly, the packed FIR filter instructions disclosed herein may be used for horizontal FIR filtering, vertical FIR filtering, or both. More generally, the packed FIR filter instructions disclosed herein may be used very effectively when filtering in the direction of the vector and/or the data storage order in memory. Moreover, the packed FIR filter instructions disclosed herein are not limited to image processing or image filtering but may be more generally used to filter other data or signals.

Figure 2:
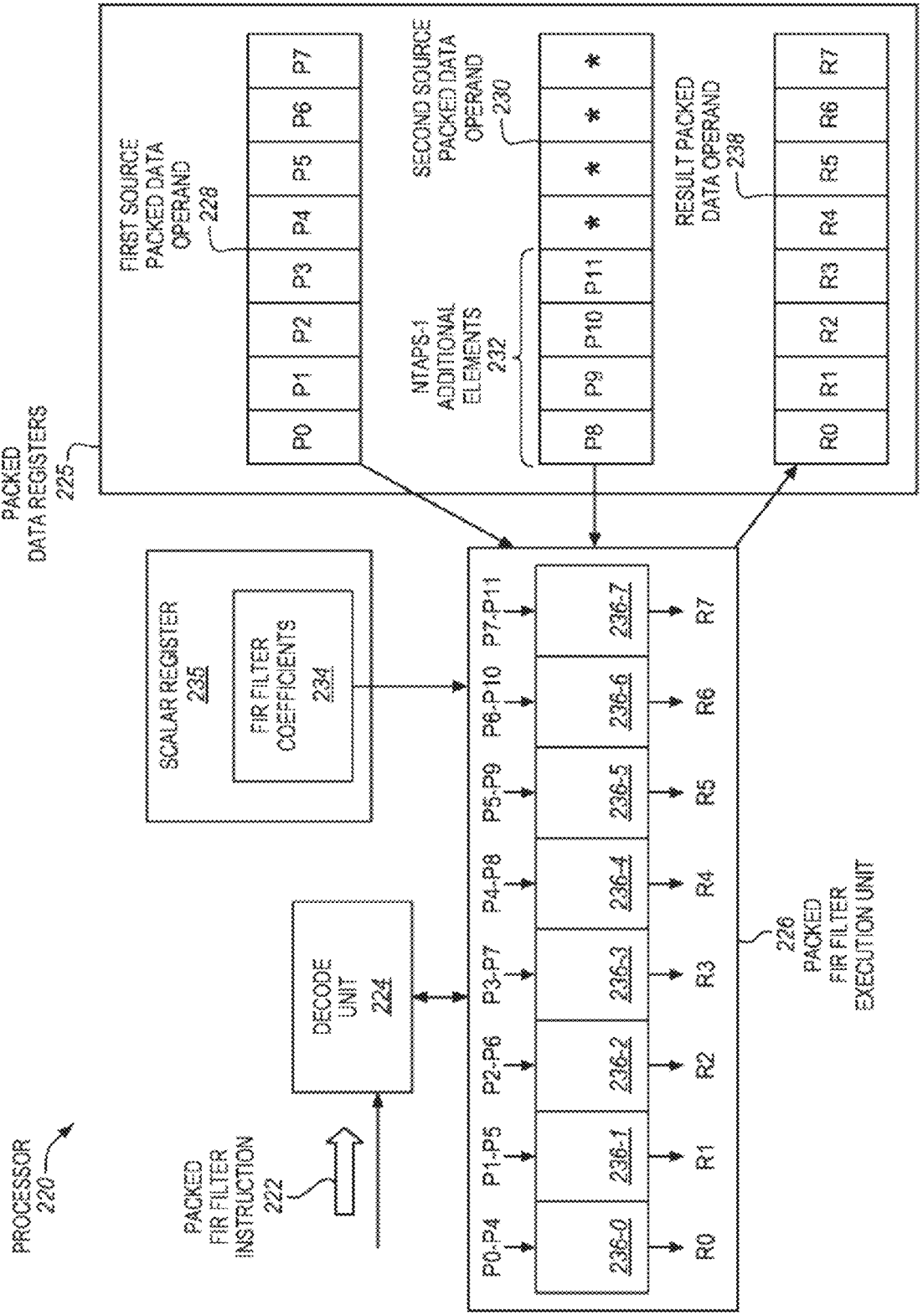
FIG. 2 is a block diagram of an embodiment of a processor that is operative to perform an embodiment of a packed FIR filter instruction.

FIG. 2 is a block diagram of an embodiment of a processor 220 that is operative to perform an embodiment of a packed FIR filter instruction 222. The packed FIR filter instruction may represent a packed, vector, or SIMD instruction. In some embodiments, the processor may be a general-purpose processor (e.g., a general-purpose microprocessor or central processing unit (CPU) of the type used in desktop, laptop, or other computers). Alternatively, the processor may be a special-purpose processor. Examples of suitable special-purpose processors include, but are not limited to, image processors, pixel processors, graphics processors, signal processors, digital signal processors (DSPs), and co-processors. The processor may have any of various complex instruction set computing (CISC) architectures, reduced instruction set computing (RISC) architectures, very long instruction word (VLIW) architectures, hybrid architectures, other types of architectures, or have a combination of different architectures (e.g., different cores may have different architectures).

During operation, the processor 220 may receive the packed FIR filter instruction 222. For example, the instruction may be received from memory over a bus or other interconnect. The instruction may represent a macroinstruction, assembly language instruction, machine code instruction, or other instruction or control signal of an instruction set of the processor. In some embodiments, the packed FIR filter instruction may explicitly specify (e.g., through one or more fields or a set of bits), or otherwise indicate (e.g., implicitly indicate), one or more source packed data operands 228, 230. In some embodiments, the instruction may optionally have operand specification fields or sets of bits to explicitly specify registers, memory locations, or other storage locations for these one or more operands. Alternatively, the storage location of one or more of these operands may optionally be implicit to the instruction (e.g., implicit to an opcode) and the processor may understand to use this storage location without a need for explicit specification of the storage location.

The one or more source packed data operands may have a first number of data elements (e.g., P0 through P7) and a second number of additional data elements 232 (e.g., P8 through P11). In some embodiments, the second number of additional data elements 232 may be at least a number that is equal to the order of the FIR filter (i.e., one less than a number of FIR filter taps of the filter) to be implemented by the instruction. Collectively, the first and second numbers of data elements (e.g., data elements P0 through P11) represent a set of data elements sufficient to generate the first number of FIR filtered result data elements (e.g., R0 through R7). In other words, one FIR filtered result data element for each of the first number of source data elements.

In the illustrated embodiment, the one or more source packed data operands include a first source packed data operand 228, and a second source packed data operand 230. The first source packed data operand 228 has the first number of data elements (e.g., P0 through P7), and the second source packed data operand 230 has the second number of additional data elements (e.g., P8 through P11). The first number of data elements (e.g., P0 through P7) span an entire bit width of the first source packed data operand. Conversely, the second number of additional data elements (e.g., P8 through P11) may be grouped together at one end of the second source packed data operand. The data elements P8-P11 may be adjacent to the data elements P0-P7, or at least neighbor the data elements P0-P7, as appropriate for the particular implemented FIR filter. Other data elements may also optionally be provided, although as shown asterisks (*) are used to indicate that they are not needed or used by the instruction/operation. Optionally, if it makes the overall algorithm more efficient, existing data elements already in the register or operand may optionally be retained and just ignored. In other embodiments, the first and second numbers of data elements may be provided differently in one or more source packed data operands. For example, in another embodiment, a single wider source packed data operand that is wider than a result packed data operand by at least the second number of data elements may optionally be used to provide both the first and second numbers of data elements. As another example, three source packed data operands may optionally be used to provide the first and second numbers of data elements. The first and second source packed data operands may exhibit "spatial" SIMD in which the elements are transferred together in an operand (e.g., over a bus) and stored in packed data registers that have breaks in the carry chain between data elements, etc.

In the illustrated example, the first number of data elements is eight (i.e., P0 through P7), although fewer or more data elements may optionally be used in other embodiments. For example, in various embodiments, the first number may be 4, 8, 16, 32, 64, or 128, or a non-power of two number.

In the illustrated example, the second number of data elements is four (i.e., P8 through P11) which may be used for a fourth order or five tap FIR filter, although fewer or more data elements may optionally be used in other embodiments. For example, second number may be equal to the order of the filter (i.e., NTAPS−1) and the order of the filter may range from 1 through about 11, although the scope of the invention is not so limited. In some embodiment, each data element (e.g., P0 through P11) may be 8-bits, 16-bits, or 32-bits fixed point. For example, in one embodiment, each data element may have an integer or fixed point format that is one of 8-bit, 16-bit, and 32-bit signed in two's complement form, although this is not required.

Convolution with FIR filtering often relies on data adjacency. In some embodiments, the data elements of the first number of data elements (e.g., P0 through P7) may represent adjacent/contiguous data elements, or at least neighboring data elements (consistent with the particular FIR filter), in an image or other data structure (e.g., adjacent pixels in one row of an image). Similarly, the data elements of the second number of data elements (e.g., P8 through P11) may represent additional adjacent/contiguous data elements, or at least neighboring data elements, in the same data structure (e.g., adjacent pixels in the same row of the same image). In addition, the data elements P8-P11 may be adjacent/contiguous, or at least neighboring, with the data elements P0-P7. For example, data element P8 may represent a pixel that is immediately adjacent to pixel P7 in the row of pixels. In some embodiments, the adjacency may be achieved after one or more linear operations (e.g., performed with one or more permutation matrices) descriptive of poly-phase structures. Representatively, the packed FIR filter instruction 222 may be used to filter a subset of pixels (e.g., in this case eight) of an image, and an algorithm may use multiple such instructions to progressively move or "slide" through different contiguous subsets of the pixels of the image. For example, in an algorithm, a subsequent instance of the packed FIR filter instruction may indicate the second source packed operand 230 of the earlier executed packed FIR filter instruction 222 as a new first source packed data operand analogous to operand 228. In some embodiments, the data elements may represent pixels of a digital image that has been acquired by a digital camera, cell phone, scanner, or other digital image capture device of a system in which the processor is included, or that has been received over a network interface, wireless interface, or other input/output device of a system in which the processor is included. Other embodiments are not limited to pixels or image processing.

Referring again to FIG. 2, the processor 220 also includes a set of packed data registers 225. Each of the packed data registers may represent an on-die storage location that is operative to store packed data, vector data, or Single instruction, multiple data (SIMD) data. The packed data registers may represent architecturally-visible or architectural registers that are visible to software and/or a programmer and/or are the registers indicated by instructions of the instruction set of the processor to identify operands. These architectural registers are contrasted to other non-architectural registers in a given microarchitecture (e.g., temporary registers, reorder buffers, etc.). The packed data registers may be implemented in different ways in different microarchitectures and are not limited to any particular type of design. Examples of suitable types of registers include, but are not limited to, dedicated physical registers, dynamically allocated physical registers using register renaming, and combinations thereof. Example sizes of the packed data registers include, but are not limited to, 64-bit, 128-bit, 256-bit, 512-bit, or 1024-bit packed data registers.

In some embodiments, the first source packed data operand 228 may optionally be stored in a first packed data register, the second source packed data operand 230 may optionally be stored in a second packed data register, and the destination where the result packed data operand 238 is to be stored may also optionally be a (not necessarily different) packed data register. Alternatively, memory locations, or other storage locations, may optionally be used for one or more of these operands. Moreover, in some embodiments, a storage location used for one of the first and second source packed data operands may optionally be reused as a destination for the result packed data operand. For example, a source/destination register may be explicitly specified once by the instruction, and may be implicitly or impliedly understood to be used for both the source operand and the result operand.

Referring again to FIG. 2, in some embodiments, the instruction may also explicitly specify, or otherwise indicate (e.g., implicitly indicate), a plurality of FIR filter coefficients 234. For example, as shown in the illustrated embodiment, the instruction may specify or otherwise indicate one or more general-purpose registers or other scalar registers 235 that are used to store one or more operands having the FIR filter coefficients. Alternatively, the instruction may have an immediate operand to provide the FIR filter coefficients. A combination of such approaches may also optionally be used.

The filter coefficients generally significantly affect the quality of the filter. In order to improve the quality of the filter, it is generally desirable to have more filter coefficients, and filter coefficients with more bits. However, more filter coefficients, and filter coefficients with more bits, both increase the total number of bits needed to provide the filter coefficients. In some embodiments, the filter coefficients may optionally be provided in a "compressed" format in one or more operands of the instruction (e.g., an immediate, one or more scalar registers, etc.). The compressed format may help to allow more filter coefficient information to be provided in fewer bits.

Embodiments are not limited to any known size of the FIR filter coefficients. Different sizes may be used in different embodiments. The coefficients largely define or specify the filter and accordingly embodiments allow the coefficients to have sizes appropriate to define or specify a wide variety of different types of filters. However, in some embodiments, in order to simplify the design for certain implementations, each of the FIR filter coefficients may have 16-bits or less, 12-bits or less, or 8-bits or less. For example, in various embodiments, each of the FIR filter coefficients may have from four to seven bits, or from four to six bits, or from four to five bits, although this is not required. The FIR filter coefficients may also optionally have more bits, although this may tend to increase the sizes and complexities of the execution unit (e.g., multipliers thereof), especially when the number of taps is great. In addition, this may increase the number of bits of the operand(s) needed to provide the coefficients.

The FIR filter coefficients may have various encodings and/or data formats, such as, for example, 1's complement, 2's complement, integer, floating point, and the like. In some embodiments, the filter coefficients may optionally have a floating point format in which they each have a mantissa, a sign, and an exponent or shift factor. In some embodiments, a custom or internal floating point format may optionally be used. The custom or internal floating point format point may not be a standard floating-point format, such as 16-bit half precision, 32-bit single precision, or the like. Rather, the custom or internal floating point format point may optionally be a non-standard floating point format. In some embodiments, the floating-point format may have less than 16-bits, less than 12-bits, or 8-bit or less.

In some embodiments, the instruction may optionally use the same number of FIR filter coefficients as the number of taps (NTAPS) of the FIR filter. In other embodiments, the instruction may optionally use a lesser number of FIR filter coefficients than the number of taps (NTAPS), and one or more FIR filter coefficients may optionally be used for multiple of the taps, such as, for example, by mirroring or otherwise reusing the FIR filter coefficients in a symmetric configuration, mirroring and negating the FIR filter coefficients in a semi-symmetric configuration, or the like. For example, in various embodiments, there may be one FIR filter coefficient and two taps, three FIR filter coefficients and five taps, four FIR filter coefficients and seven taps, or five FIR filter coefficients and nine taps, to name just a few examples. In some embodiments, the instruction may explicitly specify or implicitly indicate the way in which the coefficients are to be used, for example, if they are to be used in a symmetric, semi-symmetric, or independent coefficient configuration. As one example, an opcode of the instruction may optionally be used to solely implicitly indicate the way in which the coefficients are to be used. As another example, the opcode together with one or more additional bits of the instruction (e.g., an FIR filter indication field) may be used, for example, with the one or more additional bits selecting between or otherwise indicating one of multiple different ways the opcode may use the coefficients.

Referring again to FIG. 2, the processor includes a decode unit or decoder 224. The decode unit may receive and decode the packed FIR filter instruction. The decode unit may output one or more relatively lower-level instructions or control signals (e.g., one or more microinstructions, micro-operations, micro-code entry points, decoded instructions or control signals, etc.), which reflect, represent, and/or are derived from the relatively higher-level packed FIR filter instruction. In some embodiments, the decode unit may include one or more input structures (e.g., port(s), interconnect(s), an interface) to receive the instruction, an instruction recognition and decode logic coupled therewith to recognize and decode the instruction, and one or more output structures (e.g., port(s), interconnect(s), an interface) coupled therewith to output the lower-level instruction(s) or control signal(s). The decode unit may be implemented using various different mechanisms including, but not limited to, microcode read only memories (ROMs), look-up tables, hardware implementations, programmable logic arrays (PLAs), and other mechanisms suitable for implementing decode units.

In some embodiments, instead of the packed FIR filter instruction being provided directly to the decode unit, an instruction emulator, translator, morpher, interpreter, or other instruction conversion module may optionally be used. Various types of instruction conversion modules may be implemented in software, hardware, firmware, or a combination thereof. In some embodiments, the instruction conversion module may be located outside the processor, such as, for example, on a separate die and/or in a memory (e.g., as a static, dynamic, or runtime emulation module). By way of example, the instruction conversion module may receive the packed FIR filter instruction, which may be of a first instruction set, and may emulate, translate, morph, interpret, or otherwise convert the packed FIR filter instruction into one or more corresponding intermediate instructions or control signals, which may be of a second different instruction set native to the decoder of the processor. The one or more intermediate instructions or control signals of the second instruction set may be provided to a decode unit (e.g., decode unit 224), which may decode them into one or more lower-level instructions or control signals executable by hardware of the processor (e.g., one or more execution units).

Referring again to FIG. 2, a packed SIMD FIR filter execution unit 226 is coupled with an output of the decode unit 224, with the packed data registers 225 or otherwise coupled with the one or more source operands (e.g., operands 228, 230), and is coupled with the scalar register 235, or otherwise coupled to receive the FIR filter coefficients 234. The execution unit may receive the one or more decoded or otherwise converted instructions or control signals that represent and/or are derived from the packed FIR filter instruction. The execution unit may also receive the one or more source packed data operands (e.g., operands 228 and 230), and the FIR filter coefficients 234. The execution unit is operative in response to and/or as a result of the packed FIR filter instruction (e.g., in response to one or more instructions or control signals decoded therefrom) to store the result packed data operand 238 in a destination storage location indicated by the instruction.

The result packed data operand 238 may include the first number of FIR filtered data elements (e.g., R0 through R7). These FIR filtered data elements may represent result data elements of the instruction. In the illustrated example embodiment, the result operand optionally includes eight result data elements R0 through R7, although fewer or more may optionally be used in other embodiments. For example, there may be one FIR filtered data element for each of the data elements of the first source packed data operand 228. In some embodiments, each of the FIR filtered data elements may be based on an arithmetic combination of multiplication products of the plurality of FIR filter coefficients 234 and a different corresponding subset of data elements from the one or more source packed data operands. Each different corresponding set of data elements may be equal in number to the number of FIR filter taps. In some embodiments, each of the FIR filtered data elements may also optionally be based on shifting and/or saturating the corresponding arithmetic combination of the corresponding multiplication products of the FIR filter coefficients and the different corresponding set of data elements.

Referring to FIG. 2, in the illustrated example for a five tap filter, FIR filtered data element R0 may be based on an arithmetic combination of multiplication products of the plurality of FIR filter coefficients and the set of data elements P0 through P4, FIR filtered data element R1 may be based on an arithmetic combination of multiplication products of the plurality of FIR filter coefficients and the set of data elements P1 through P5, and so on. As shown, each of the different corresponding sets of data elements include different data elements than all the other sets. In this example, each FIR filtered data element is based on FIR filtering on five data elements (for this five tap filter) of the source operands starting with a data element in a corresponding bit position (e.g., R0 and P0 are in corresponding positions, R2 and P2 are in corresponding positions, etc.). In addition, the different corresponding sets move or slide across a logical concatenation of the first and second numbers of data elements (e.g., P0 through P7 and P8 through P11) utilizing data elements from same relative data element positions for the different data element positions of the FIR filtered result data elements (e.g., P1-P5 are in same relative data element positions relative to R1 as P0-P4 are relative to R0, etc.). R0, which is a least (or most) significant FIR filtered data element, may be based on a corresponding set of NTAPS respective least (or most) significant data elements in the first source packed data operand. As shown, in some embodiments, some of the FIR filtered data elements (e.g., R0 through R3 in the illustrated example) may not be based on FIR filtering involving any of the filter-order number (e.g., NTAPS−1) of additional data elements 232 (e.g., P8 through P11), whereas other of the FIR filter results (e.g., R4 through R7 in the illustrated example) may be based on FIR filtering involving one or more of the filter-order number (e.g., NTAPS−1) of additional data elements 232 (e.g., P8 through P11).

In some embodiments, the FIR filtered result data elements may optionally be based on combinations of products involving a different FIR filter coefficient for each of the taps. In other embodiments, the FIR filtered result data elements may optionally be based on products involving fewer FIR filter coefficients than the number of taps, and one or more of the FIR filter coefficients may be reused, or negated and reused, for one or more of the taps. In some embodiments, the instruction may optionally indicate one or more sign values to be used to invert or change a sign of a coefficient or a product of a coefficient and a data element. In various embodiments, the result packed data operand may represent a result of FIR filtering, polyphase FIR filtering (e.g., based on filtering odd or even positioned samples), or QMF filtering.

In some embodiments, each result element (R) may have a same precision as the source data elements (P). In other embodiments, each result element may have twice the precision as the source data elements. Another suitable result format is an extended precision format in which (integer) most significant bits are added to provide an increased range (e.g., log 2(N) additional bits added when adding N items). For example, in one specific example embodiment, the source elements may be 16-bit signed integer or fixed point in two's complement form, and the result elements may be 32-bit signed integer or fixed point in two's complement form, although this is not required. When the source and result elements are the same size, a single register, having the same size as the register used for the first source packed data operand, may be used for the destination. Conversely, when the result elements are twice the size of the source elements, either a register twice the size may be used for the destination, or two registers of the same size as the register used to store the first source packed data operand may be used for the destination. In various embodiments, the result packed data operand may correspond to any of the filter operations shown in Tables 1-2 and/or FIGS. 4-7, although the scope of the invention is not so limited.

The execution unit and/or the processor may include specific or particular logic (e.g., transistors, integrated circuitry, or other hardware potentially combined with firmware (e.g., instructions stored in non-volatile memory) and/or software) that is operative to perform the packed FIR filter instruction and/or store the result in response to and/or as a result of the packed FIR filter instruction (e.g., in response to one or more instructions or control signals decoded from the FIR filter instruction). By way of example, the execution unit may include an arithmetic unit, an arithmetic logic unit, a multiplication and accumulation unit, or a digital circuit to perform arithmetic or arithmetic and logical operations, or the like. In some embodiments, the execution unit may include one or more input structures (e.g., port(s), interconnect(s), an interface) to receive source operands, circuitry or logic coupled therewith to receive and process the source operands and generate the result operand, and one or more output structures (e.g., port(s), interconnect(s), an interface) coupled therewith to output the result operand.

In some embodiments, the execution unit may include a different corresponding FIR filter 236 for each of the data elements in the first source packed data operand (e.g., P0 through P7) and/or each of the result data elements (e.g., R0 through R7). FIR filter 236-0 may perform an FIR filter operation on input elements P0 through P4 to generate a result element R0, and so on. The elements of the packed data operands may either be processed in parallel and concurrently using a "spatial" SIMD arrangement, or subsets of the elements may optionally be processed sequentially utilizing "temporal" type of vector processing (e.g., over a number of clock cycles that depends on the number of subsets of elements processed). In some embodiments, each of the FIR filters 236 may include the circuitry, components, or logic of any of FIGS. 4-6, or FIGS. 19-26 which are illustrative examples of suitable microarchitectural FIR filter configurations, although the scope of the invention is not so limited.

Advantageously, the packed FIR filter instructions may help to increase the performance of FIR filtering and/or may make it easier for the programmer, especially when FIR filtering in the "vector direction" where up to the filter order number of additional data elements beyond those in a source packed data operand are needed. The instructions may help to simplify the horizontal access requirements. Generally, no more than two source packed data operands are used to provide all the data elements sufficient to generate a result packed data operands worth of FIR filtered result data elements. There is no need for further external data dependencies. Alignment operations may be omitted which may help to increase performance.

To avoid obscuring the description, a relatively simple processor 220 has been shown and described. However, the processor may optionally include other processor components. For example, various different embodiments may include various different combinations and configurations of the components shown and described for FIGS. 11-13. All of the components of the processor may be coupled together.

Figure 3:
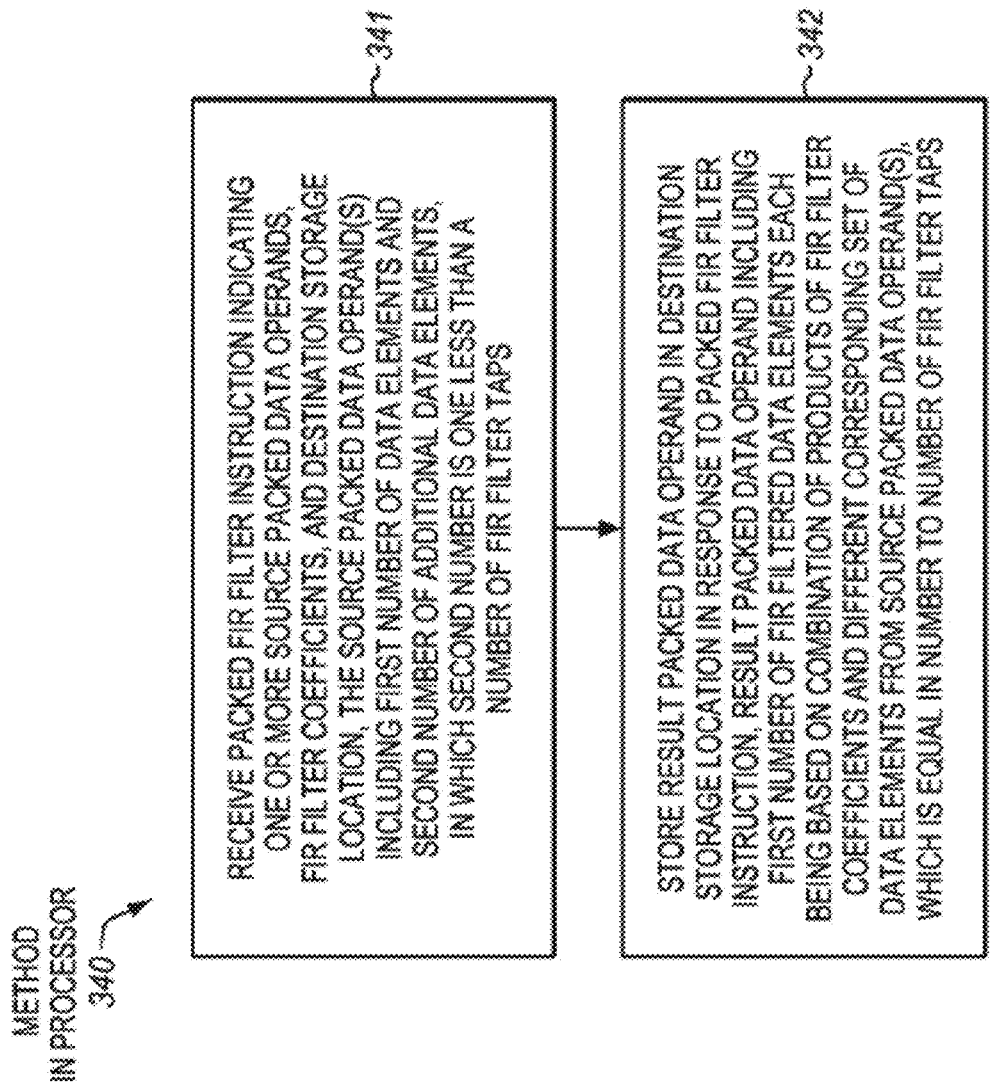
FIG. 3 is a block flow diagram of an embodiment of a method of performing an embodiment of a packed FIR filter instruction.

FIG. 3 is a block flow diagram of an embodiment of a method 340 of performing an embodiment of a packed FIR filter instruction. In various embodiments, the method may be performed by a processor, instruction processing apparatus, or other digital logic device. In some embodiments, the method of FIG. 3 may be performed by and/or within the processor of FIG. 2. The components, features, and specific optional details described herein for the processor of FIG. 2, also optionally apply to the method of FIG. 3. Alternatively, the method of FIG. 3 may be performed by and/or within a similar or different processor or apparatus. Moreover, the processor of FIG. 2 may perform methods the same as, similar to, or different than those of FIG. 3.

The method includes receiving the packed FIR filter instruction, at block 341. In various aspects, the instruction may be received at a processor or a portion thereof (e.g., an instruction fetch unit, a decode unit, a bus interface unit, etc.). In various aspects, the instruction may be received from an off-processor and/or off-die source (e.g., from memory, interconnect, etc.), or from an on-processor and/or on-die source (e.g., from an instruction cache, instruction queue, etc.). The packed FIR filter instruction may specify or otherwise indicate one or more source packed data operands (e.g., a first and second source packed data operand), a plurality of FIR filter coefficients, and a destination register or other storage location. The one or more source packed data operands may include a first number of data elements and a second number of additional data elements. The second number may be one less than a number of FIR filter taps of an FIR filter to be implemented for the instruction.

The method also includes storing a result packed data operand in the destination storage location in response to and/or as a result of the packed FIR filter instruction, at block 342. The result packed data operand may include the first number of FIR filtered data elements. Each of the FIR filtered data elements may be based on a combination of products of the plurality of FIR filter coefficients and a different corresponding set of data elements from the one or more source packed data operands. The corresponding set of data elements may be equal in number to the number of FIR filter taps. The instruction, the one or more source operands, the coefficients, the result operand, and the generation of the result operand may optionally have any of the optional characteristics or features disclosed elsewhere herein.

The illustrated method involves architectural operations (e.g., those visible from a software perspective). In other embodiments, the method may optionally include one or more microarchitectural operations. By way of example, the instruction may be fetched, decoded, scheduled out-of-order, source operands may be accessed, an execution unit may perform microarchitectural operations to implement the instruction (e.g., multiplications, additions, shifting, saturation, etc.). In some embodiments, the microarchitectural operations to implement the instruction may optionally include any of the operations shown and described for any of FIGS. 4-6 and 19-26 although the scope of the invention is not so limited.

Figure 4:
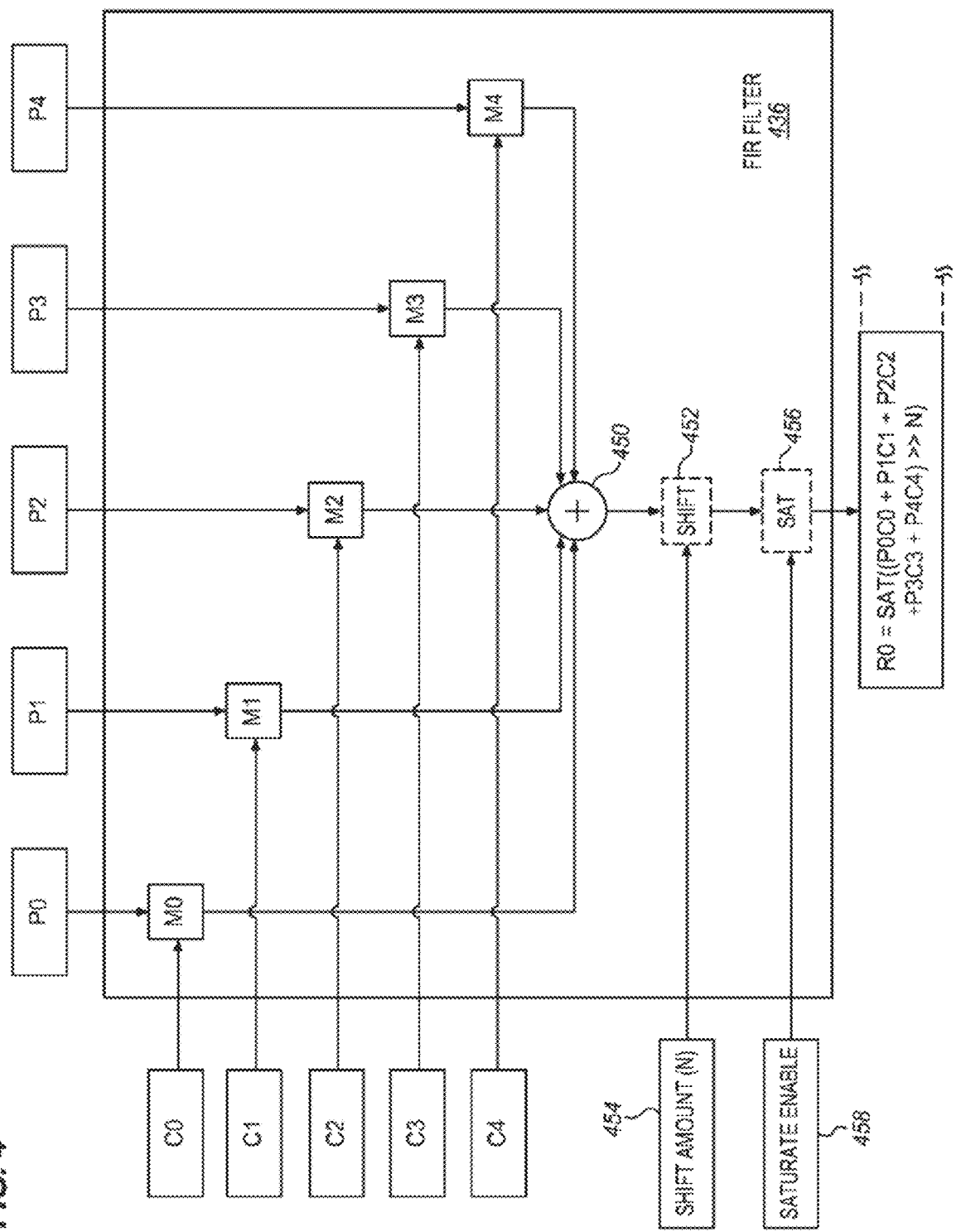
FIG. 4 is a block diagram of a first example embodiment of an FIR filter.

FIG. 4 is a block diagram of a first example embodiment of an FIR filter 436. The illustrated FIR filter is a five tap filter, although fewer or more taps may optionally be used in other embodiments. The FIR filter includes a different corresponding multiplier for each tap. In this case, the five tap FIR filter includes first through fifth multiplier units M0 through M4. In this embodiment, the FIR filter is coupled to receive five data elements P0 through P4, and five coefficients C0 through C4, as input. The data elements P0 through P4 represent a corresponding set of five data elements that correspond to an FIR filtered result data element R0. In this embodiment, each of these five data elements is to be multiplied by a different one of the five coefficients. Specifically, M0 is coupled to receive, and is operative to multiply, P0 and C0 to generate and output a first product. M1 is coupled to receive, and is operative to multiply, P1 and C1 to generate and output a second product. M2 is coupled to receive, and is operative to multiply, P2 and C2 to generate a third product. M3 is coupled to receive, and is operative to multiply, P3 and C3 to generate and output a fourth product. M4 is coupled to receive, and is operative to multiply, P4 and C4 to generate and output a fifth product.

One or more adder units 450 of the FIR filter are coupled with outputs of the multipliers to receive the products. The one or more adder units are operative to add, accumulate, or otherwise combine all of the products and to output a single sum or other arithmetic combination of all the products. By way of example, the one or more adder units may include a carry save adder unit tree. Collectively, the multiplier units and the adder unit(s) may perform a full multiply-accumulate operation. In some embodiments, an intermediate selection network may optionally be included to allow the adder unit(s) (e.g., an adder tree) to more freely or flexibly choose which of the products will be combined together.

In some embodiments, the FIR filter may optionally include an optional shift unit 452 coupled with an output of a last one of the one or more adder units to receive the sum or other combination of the products. The optional shift unit 452 may be operative to right shift the sum a number of bit positions, which may be used to scale the sum. The FIR filtered data element R0 may be based on shifting the combination of the products. Optionally, rounding may be performed before shifting by inserting a binary '1' in a zero vector (right behind the comma) and inserting that signal into the one or more adder units. In some embodiments, an associated packed FIR filter instruction may indicate a flexible shift amount 454 for the right shift.

The FIR filter may optionally include an optional saturation unit 456. As shown, the saturation may be coupled with an output of the optional shift unit. Alternatively, the saturation unit may be coupled with an output of the one or more adder units if the shift unit is omitted. The optional saturation unit may saturate or clamp its input value to one of a maximum and minimum allowed value for its associated output data type. In some embodiments, the packed FIR filter instruction may have a saturate indication 458 (e.g., a bit of the instruction) to indicate and control whether or not saturation is enabled or disabled. The FIR filter may output a final FIR filtered pixel or other element as a result element R0. The result element R0 may be stored in destination register or other destination storage location. In some embodiments, the result element R0 may equal a saturated (SAT) value of, an N-bit shifted sum of, the products P0C0 plus P1C1 plus P2C2 plus P3C3 plus P4C4 all added together. Other result elements may have analogous results. However, this is just one example.

The illustrated example embodiment of the FIR filter 436 has five taps, although other embodiments may have either fewer or more than five taps. For example, in various embodiments, the FIR filter may instead optionally have three, seven, nine, or some other number of taps, and the same number of FIR filter coefficients. Also, an FIR filter with a given number of taps may optionally be used to implement a filter with a lesser number of taps by setting one or more coefficients to zero. Conversely, the FIR filter with the given number of taps may optionally be used to implement a filter with a greater number of taps by combining two or more of FIR filter operations. By way of example, an accumulation with a sequencer and register inside the operation can be used to create larger filters in multiple cycles, while reusing the multiplier and adder units so that the larger filter does not incur a larger area or manufacturing cost.

Figure 5:
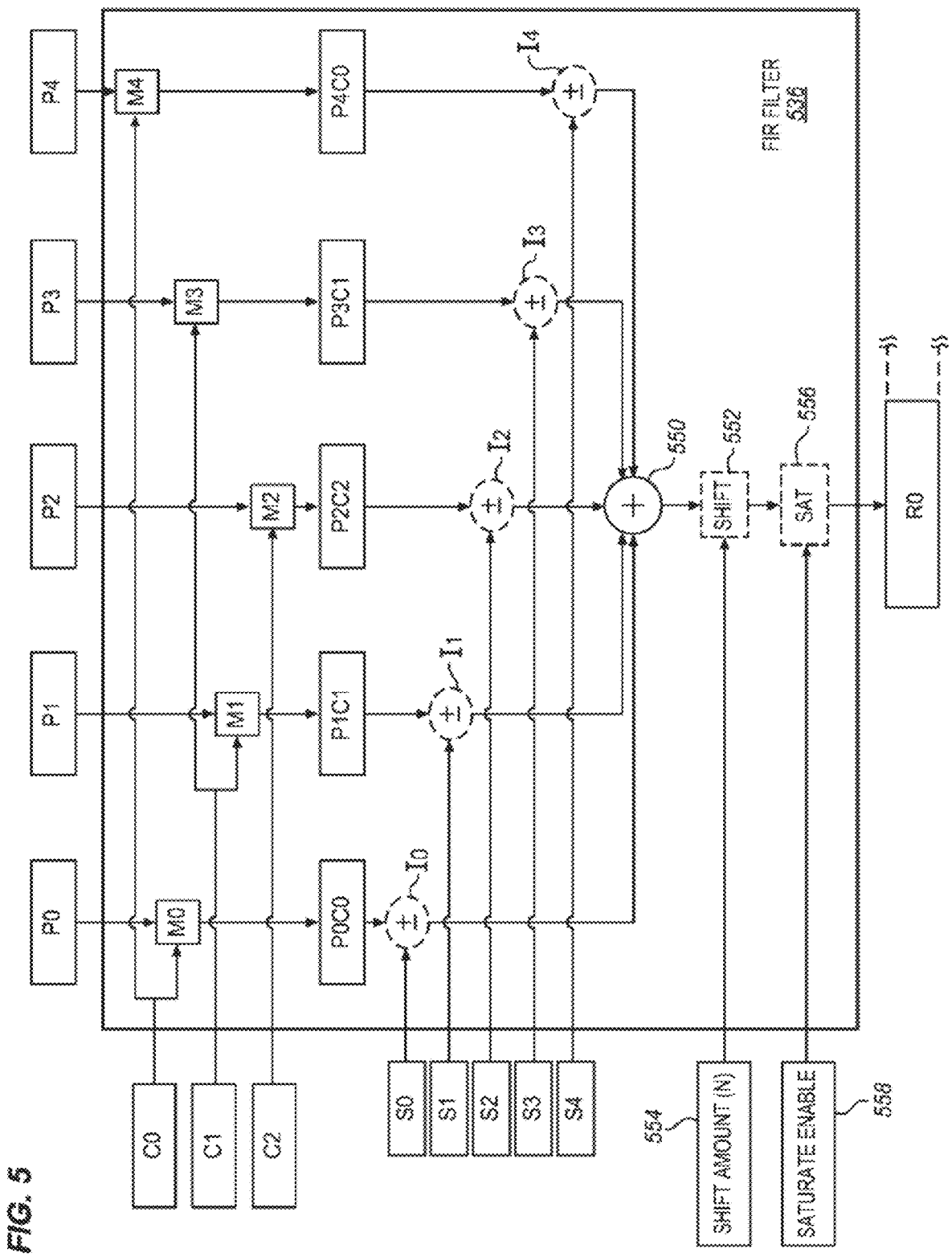
FIG. 5 is a block diagram of a second example embodiment of an FIR filter.

FIG. 5 is a block diagram of a second example embodiment of an FIR filter 536. In various embodiments, the FIR filter may be used to implement a three tap FIR filter with three independent coefficients (C0 through C3), a symmetrical five tap FIR filter with three independent coefficients (C0 through C3) and in which some coefficients are mirrored or otherwise reused, a semi-symmetrical five tap FIR filter with three independent coefficients (C0 through C3) and in which some coefficients are mirrored or otherwise reused and negated.

The illustrated FIR filter includes first through fifth multiplier units M0 through M4. In this illustrative five tap FIR filter embodiment, the FIR filter is coupled to receive five data elements P0 through P4, and only three coefficients C0 through C2, as input. Other embodiments may use other numbers of data elements and/or other numbers of coefficients. M0 is coupled to receive, and is operative to multiply, P0 and C0 to generate and output a first product P0*C0. M1 is coupled to receive, and is operative to multiply, P1 and C1 to generate and output a second product P1*C1. M2 is coupled to receive, and is operative to multiply, P2 and C2 to generate a third product P2*C2. M3 is coupled to receive, and is operative to multiply, P3 and C1 to generate and output a fourth product P3*C1. M4 is coupled to receive, and is operative to multiply, P4 and C0 to generate and output a fifth product P4*C0. In the illustration, the P1 C0, P1C1, and so on may either merely designate labels for the products, or may represent temporary registers to store the products.

Notice that coefficient C0 is provided to and used by both M0 and M4, and that coefficient C1 is provided to and used by both M1 and M3. Rather than specifying five independent coefficients, only three independent coefficients may be specified, and two coefficients may either be reused for or derived from and then reused for two taps. Advantageously, this may help to reduce the size and/or complexity of the FIR filter. In some embodiments, this may allow fewer multipliers to be used, which may tend to significantly decrease the overall amount of logic of the FIR filter. For example, rather than needing to multiply five coefficients by five data elements, only three coefficients may be multiplied by five data elements, and some of the products may be re-routed and reused where appropriate for multiple of the FIR filtered result data elements. This will be discussed further below in conjunction with FIG. 6.

In some embodiments, the FIR filter may optionally include one or more optional sign inversion units to change the sign of or perform sign inversion on one or more of the coefficients or the products associated therewith. In the particular illustrated example embodiment, the FIR filter includes an optional first sign inversion unit I0, an optional second sign inversion unit I1, an optional third sign inversion unit I2, an optional fourth sign inversion unit I3, and an optional fifth sign inversion unit I4. In this embodiment, there is a sign inversion unit for each tap, although in alternate embodiments may include fewer or more sign inversion units. In the illustrated embodiment, the sign inversion units are coupled to apply or not apply corresponding sign values to or sign inversions on the corresponding products. The first sign inversion unit I0 is coupled to receive, and is operative to either apply or not apply a sign inversion to, the first product P0C0. The second sign inversion unit I1 is coupled to receive, and is operative to apply or not apply a sign inversion to, the second product P1C1, and so on.

Advantageously, such sign inversion may optionally be used to help effectively create different coefficients. Although a given coefficient and the sign inverted version of that given coefficient may not strictly be independent coefficients, they are nevertheless different. Thus, the sign inversion may help to efficiently create additional different coefficients without having to explicitly specify more independent coefficients. In addition, since sign inversion may be performed less costly than a full multiplication. By merely applying a sign to or performing sign inversion on a product, effective multiplication by a different (although perhaps not strictly independent) coefficient may be achieved without having to perform a different multiplication. Rather, two copies of the same product may be used, and sign inversion may be performed on one copy of the product but not on the other copy of the product, which generally uses less logic than would be used to perform two separate multiplications. As a result, some multipliers may potentially be eliminated through reuse of products and less costly sign inversion units. Alternatively, if desired, the sign inversion units may instead be coupled to apply or not apply the sign inversion to the corresponding coefficients prior to the multiplications. By way of example, sign inversion for each tap may be done by using the standard two's complement way in which negative=(positive XOR '1')+1. This may be achieved by inserting the inversion flag ('1' for yes) into the XOR, and also as a carry bit into the adder unit that follows. Such sign inversion is useful for certain types of filters and when combining filters.

In some embodiments, the sign inversion units (of which there may be varying numbers in varying embodiments) may employ fixed or static sign inversion. For example, a given FIR filter instruction (e.g., an opcode thereof) may have a given fixed or static set of sign inversion controls for the sign inversion units. If desired, different instructions with different opcodes may optionally be included in an instruction set to each provide a different set of fixed sign inversion controls. For example, a first instruction or opcode may not use sign inversion at all, a second instruction or opcode may fix sign inversion for only the products P3*C1 and P4*C0, a third instruction or opcode may fix sign inversion for only the products P0*C1 and P1*C1, etc. Alternatively, rather than such instruction-fixed or opcode-fixed sign inversion controls, a packed FIR filter instruction may allow flexible or programmable sign inversion controls. For example, one or more operands of the instruction, such as, for example, an immediate, a register indicated by the instruction, or the like, may provide flexible or programmable sign inversion controls S0 through S4 (or another number of such sign inversion controls as desired). The sign inversion controls may represent sign values. As one example, the sign inversion controls S0 through S4 may represent five bits in a register or immediate that may be set or cleared, respectively, to enable or disable sign inversion for the corresponding sign inversion unit. The opposite convention is also possible.

Referring again to FIG. 5, the FIR filter 536 may include one or more adder units 550 coupled with outputs of the optional sign inversion units. Alternatively, the one more adder units may optionally be coupled with outputs of the multipliers if the sign inversion units are not employed. The one or more adder units are operative to add, accumulate, or otherwise combine all of the products and to output a single sum or other arithmetic combination of all the products, as previously described. By way of example, the one or more adder units may include a carry save adder unit tree. In some embodiments, an intermediate selection network may optionally be included to allow the adder unit(s) (e.g., an adder tree) to more freely or flexibly choose which of the products will be combined together.

In some embodiments, the FIR filter may optionally include an optional shift unit 552 coupled with an output of the one or more adder units to receive the sum or other combination of the products. The optional shift unit may be operative to right shift the sum a number of bit positions, which may be used to scale the sum. The FIR filtered data element R0 may be based on shifting the combination of the products. Optionally, rounding may be performed before shifting by inserting a binary '1' in a zero vector (right behind the comma) and inserting that signal into the one or more adder units. In some embodiments, an associated packed FIR filter instruction may indicate a flexible shift amount 554 for the right shift.

The FIR filter may optionally include an optional saturation unit 556. As shown, the saturation may be coupled with an output of the optional shift unit. Alternatively, the saturation unit may be coupled with an output of the one or more adder units if the shift unit is omitted. The optional saturation unit may saturate or clamp its input value to one of a maximum and minimum allowed value for its associated output data type. In some embodiments, the packed FIR filter instruction may have a saturate indication 558 (e.g., a bit of the instruction) to indicate and control whether or not saturation is enabled or disabled. The FIR filter may output a final FIR filtered pixel or other element as a result element R0. The result element R0 may be stored in destination register or other destination storage location.

The illustrated example embodiment of the FIR filter 536 has five taps and three coefficients, although other embodiments may have fewer or more than five taps and/or other numbers of coefficients. For example, in various embodiments, the FIR filter may instead optionally have two taps and one coefficient, seven taps and four coefficients, or nine taps and five coefficients, to name just a few examples. The scope of the invention is not limited to any known number of taps or coefficients. In various embodiments, such FIR filters may be used with each tap having an independent coefficient, coefficients being mirrored to provide a symmetrical FIR filter, or coefficients being mirrored and negated to provide a semi-symmetrical FIR filter. Also, an FIR filter with a given number of taps may optionally be used to implement a filter with a lesser number of taps by setting one or more coefficients to zero. Conversely, the FIR filter with the given number of taps may optionally be used to implement a filter with a greater number of taps by combining two or more of FIR filter operations. By way of example, an accumulation with a sequencer and register inside the operation can be used to create larger filters in multiple cycles, while reusing the multiplier and adder units so that the larger filter does not incur a larger area or manufacturing cost.

Figure 6:
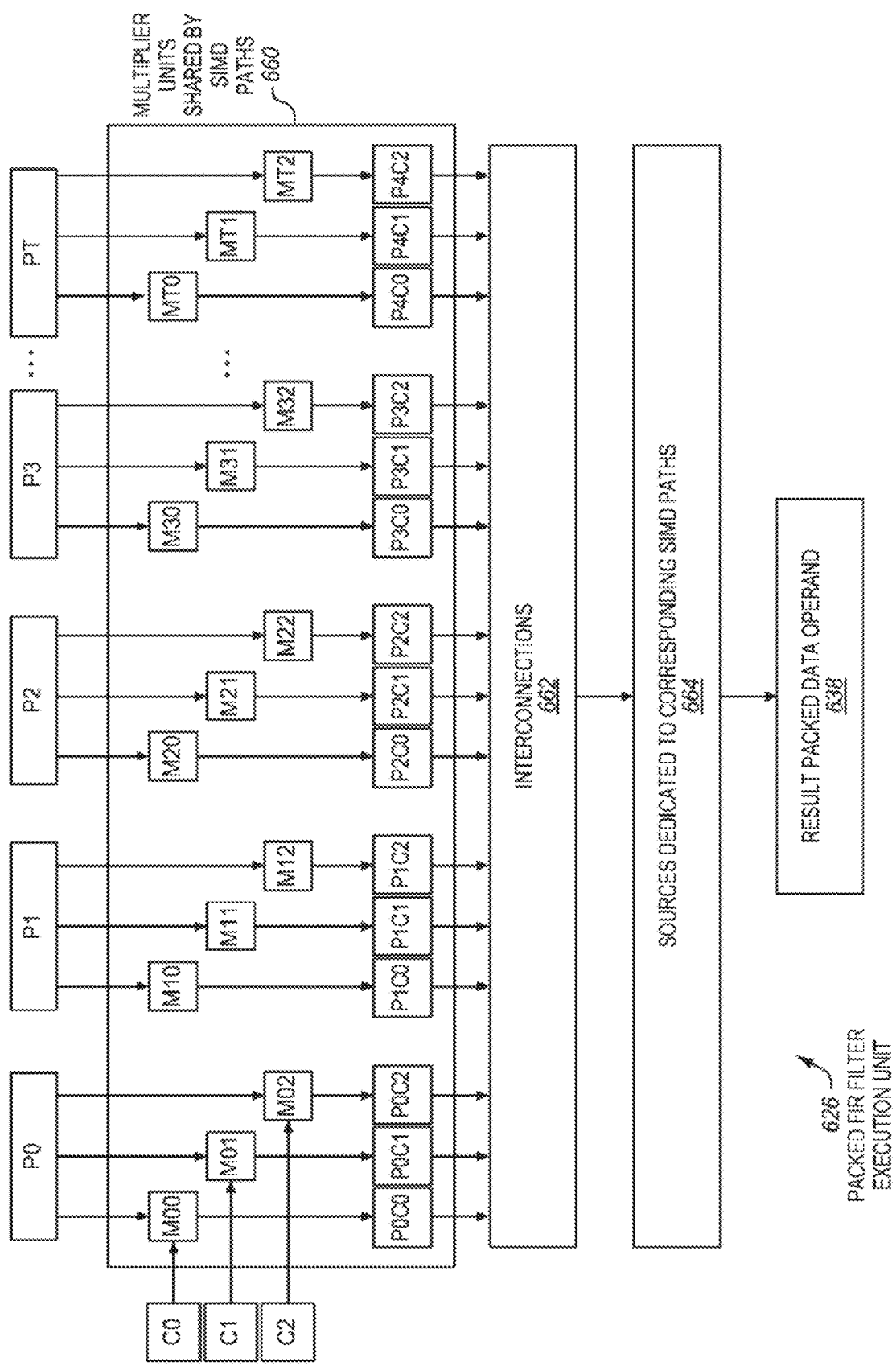
FIG. 6 is a block diagram of an embodiment of a packed FIR filter execution unit in which the number of multiplier units is reduced by reuse of products for different results.

FIG. 6 is a block diagram of an embodiment of a packed FIR filter execution unit 626 having a substantially minimum number of multiplier units 660. In the illustrated embodiment, the execution unit performs FIR filtering using only three independent coefficients (C0 through C2), although fewer or more than three coefficients may optionally be used in other embodiments. As mentioned elsewhere herein, symmetry or semi-symmetry may optionally be used to increase the number of effective different (although perhaps not strictly independent) coefficients.

The execution unit may receive a set of data elements P0 through PT. These data elements P0 through PT may represent a first number of data elements (e.g., a first number of data elements filling a vector) and also a second number of additional data elements that is equal to the order of the filter (e.g., one less than a number of filter taps (i.e., NTAPS−1)). As previously discussed, these data elements may collectively be minimally sufficient to generate the first number of FIR filtered result data elements. Each of the source data elements may correspond to a different packed or SIMD way or data path. In some embodiments, the execution unit may have both logic that is shared by multiple such packed or SIMD ways or data paths, and logic that is dedicated to a given packed or SIMD way or data path. Specifically, the execution unit may include a set of multiplier units 660 that are shared by multiple of the packed or SIMD ways, and other resources 664 that are each dedicated to a corresponding single packed or SIMD way or data path.

In some embodiments, the set of multiplier units 660 may include substantially the fewest possible number of multiplier units needed to generate all of the result data elements for a given instruction. Using the fewest number of multiplier units possible may help to significantly decrease the overall amount of logic needed to implement the execution unit. In some embodiments, the number of multiplier units may be equal to, no more than, or in some cases less than (e.g., if multiplier units at the boundary are eliminated) the number of independent coefficients (e.g., in this case three) multiplied by the number of source data elements P0 through PT. As mentioned above, the number of source data elements P0 through PT may include the first number of data elements equal to the number of packed or SIMD ways plus the filter-order number (e.g., NTAPS−1) of additional data elements. As shown, a set of three multipliers M00, M01, and M02 may correspond to data element P0, and, respectively, may be used to multiply P0 by C0, C1, and C2. Similarly, a set of three multipliers M10, M11, and M12 may correspond to data element P1, and, respectively, may be used to multiply P1 by C0, C1, and C2. A similar approach may be taken for each of the other source data elements. Effectively, the set of multiplier units may be operative to generate all possible independent products, which are shown in the illustration by respective labels. Some multiplier units at the boundaries may optionally be eliminated if they are not used for a particular implementation.

As also shown, the execution unit may have interconnections 662. The interconnections may be coupled with outputs of each of the multiplier units. The interconnections may be operative to route appropriate groups of the products to appropriate packed or SIMD ways or data paths based on the particular FIR filter being implemented. For example, to implement one particular example FIR filter, the products P0C0, P1C1, P2C2, P3C1, and P4C0 may be routed to a SIMD way corresponding to a result data element R0 which is in a same relative bit position as data element P0. The interconnections may route a single product (e.g., P1*C0 as one example) to multiple packed or SIMD ways so that it may be reused for generation of multiple FIR filtered data elements without needing to be generated by multiplication multiple times. In some embodiments, the interconnections and/or routings may be appropriate to achieve the different FIR filters shown in Tables 1-2. Certain products may be calculated once, and routed to multiple different SIMD ways. In other words, the multipliers and/or their products may be shared among multiple different SIMD ways.

The execution unit also includes the resources 664 which are dedicated to the corresponding vector, packed, or SIMD ways or data paths. These resources are coupled with the outputs of the interconnections to receive the appropriate groups of the products. These resources may include various different combinations of the resources described elsewhere herein, for example, one or more adder units, optional shift units, optional saturation units, optional sign inversion units, and the like, and various different combinations thereof. Any of the previously described combinations of these resources may optionally be used. These resources may operate substantially as described elsewhere herein. These resources may output a result packed data operand 638.

A wide variety of different types of FIR filter operations are suitable for the packed FIR filter instructions disclosed herein. Table 1 lists several examples of suitable FIR filter operations for embodiments of packed FIR filter instructions having four coefficients (C0 through C3). The instruction may indicate the four coefficients as previously described. Filter 1 has the four coefficients configured as four independent taps. Filter 2 has the four coefficients configured as seven symmetrical taps with the same coefficients used for taps 2-0 respectively mirrored and reused for taps 4-6. Filter 3 has the four coefficients configured as seven semi-symmetrical taps with the same coefficients used for taps 2-0 respectively negated or sign inverted and mirrored and reused for taps 4-6. Filters 4-6 are respectively similar to Filters 1-3 with the addition of an arithmetic right shift performed on the output using a shift amount (N), which may be indicated by the instruction. Filter 7 has the four coefficients configured as seven symmetrical taps with the same coefficients used for taps 2-0 respectively mirrored and reused for taps 4-6. Sign inversion is applied to each coefficient or each product using seven corresponding sign inversion controls (S0 through S6), which may be indicated by the instruction. These sign inversion controls or sign values allow a programmer or compiler to change the signs of any of the coefficients or products to achieve a desired FIR filter. An arithmetic right shift is performed on the output using a shift amount (N), which may also be indicated by the instruction. For simplicity, the filter operations shown in Table 1 are for a single FIR filtered result data element (R0), although it is to be understood that analogous filter operations may be performed for each of the other FIR filtered result data elements.

TABLE 1

Examples of four-coefficient filter operations

| No. | Type of Filter | Filter Operation |
|---|---|---|
| 1 | Four Independent Taps | R0 = P0C0 + P1C1 + P2C2 + P3C3 |
| 2 | Seven Symmetrical Taps with Taps 4-6 Mirrored from 2-0 | R0 = P0C0 + P1C1 + P2C2 + P3C3 + P4C2 + P5C1 + P6C0 |
| 3 | Seven Semi-Symmetrical Taps with Taps 4-6 Mirrored and Negated from 2-0 | R0 = P0C0 + P1C1 + P2C2 + P3C3 + P4(-C2) + P5(-C1) + P6(-C0) |
| 4 | Four Independent Taps, and Arithmetic Right Shift on Output | R0 = (P0C0 + P1C1 + P2C2 + P3C3) >> N |
| 5 | Seven Symmetrical Taps with Taps 4-6 Mirrored from 2-0, and Arithmetic Right Shift on Output | R0 = (P0C0 + P1C1 + P2C2 + P3C3 + P4C2 + P5C1 + P6C0) >> N |
| 6 | Seven Semi-Symmetrical Taps with Taps 4-6 Mirrored and Negated from 2-0, and Arithmetic Right Shift on Output | R0 = (P0C0 + P1C1 + P2C2 + P3C3 + P4(-C2) + P5(-C1) + P6(-00)) >> N |
| 7 | Seven Symmetrical Taps with Taps 4-6 Mirrored from 2-0, Application of Specified Signs for All Taps, and Arithmetic Right Shift on Output | R0 = (S0P0C0 + S1P1C1 + S2P2C2 + S3P3C3 + S4P4C2 + S5P5C1 + S6P6C0) >> N |

Table 2 lists several examples of suitable FIR filter operations for embodiments of packed FIR filter instructions having three coefficients (C0 through C2). The instruction may indicate the three coefficients as previously described. Filter 8 has the three coefficients configured as three independent taps. Filter 9 has the three coefficients configured as five symmetrical taps with the same coefficients used for taps 1-0 respectively mirrored and reused for taps 3-4. Filter 10 has the three coefficients configured as five semi-symmetrical taps with the same coefficients used for taps 1-0 respectively negated or sign inverted and mirrored and reused for taps 3-4. Filters 11-13 are respectively similar to Filters 8-10 with the addition of an arithmetic right shift performed on the output using a shift amount (N), which may be indicated by the instruction. Filter 14 has the three coefficients configured as five symmetrical taps with the same coefficients used for taps 1-0 respectively mirrored and reused for taps 3-4. Sign inversion is applied to each coefficient or each product using five corresponding sign inversion controls (S0 through S4), which may be indicated by the instruction. These sign inversion controls or sign values allow a programmer or compiler to change the signs of any of the coefficients or products to achieve a desired FIR filter. An arithmetic right shift is performed on the output using a shift amount (N), which may also be indicated by the instruction.

TABLE 2

Examples of three-coefficient filter operations.

| No. | Type of Filter | Filter Operation |
|---|---|---|
| 8 | Three Independent Taps | R0 = P0C0 + P1C1 + P2C2 |
| 9 | Five Symmetrical Taps with Taps 3-4 Mirrored from 1-0 | R0 = P0C0 + P1C1 + P2C2 + P3C1 + P4C0 |
| 10 | Five Symmetrical Taps with Taps 3-4 Mirrored and Negated from 1-0 | R0 = P0C0 + P1C1 + P2C2 + P3(-C1) + P4(-C0) |
| 11 | Three Independent Taps, and Arithmetic Right Shift on Output | R0 = (P0C0 + P1C1 + P2C2) >> N |
| 12 | Five Symmetrical Taps with Taps 3-4 Mirrored from 1-0, and Arithmetic Right Shift on Output | R0 = (P0C0 + P1C1 + P2C2 + P3C1 + P4C0) >> N |
| 13 | Five Symmetrical Taps with Taps 3-4 Mirrored and Negated from 1-0, and Arithmetic Right Shift on Output | R0 = (P0C0 + P1C1 + P2C2 + P3(-C1) + P4(-00)) >> N |
| 14 | Five Symmetrical Taps with Taps 3-4 Mirrored from 1-0, Application of Specified Signs for All Taps, and Arithmetic Right Shift on Output | R0 = (S0P0C0 + S1P1C1 + S2P2C2 + S3P3C1 + S4P4C0) >> N |

For simplicity, the filter operations shown in Tables 1-2 are for a single FIR filtered result data element (R0), although it is to be understood that analogous filter operations may be performed for each of the other FIR filtered result data elements. Other analogous embodiments are also contemplated for packed FIR filter instructions having other numbers of coefficients, such as, for example, five coefficients, two coefficients, one coefficient, etc.

In some embodiments, each of the different FIR filters and FIR filter operations shown in Tables 1-2 may be implemented by a different instruction (e.g., a different opcode). The instruction (e.g., the opcode thereof) may indicate whether the filter uses each of the coefficients as an independent tap, whether symmetry is applied and the symmetry pattern, whether semi-symmetry is applied and the pattern, etc. For example, a decode unit upon decoding an opcode may understand that an implied, but not explicitly specified, symmetry pattern or semi-symmetry pattern is to be used for the coefficients. This may help to reduce the amount of encoding needed to provide the coefficients, but is not required.

In other embodiments, an instruction may flexibly implement two or more FIR filters and FIR filter operations from Table 1 and/or Table 2. For example, the instruction may have or indicate a set of bits which can have different values to flexibly specify or select between two or more different FIR filter operations. This set of bits may be in an immediate or other non-opcode set of bits of the instruction, or may be in a register indicated by the instruction, to name a few examples. By way of example, a four coefficient instruction with a given opcode may have a field to specify whether the four coefficients are to be used in an independent coefficient configuration, a symmetrical coefficient configuration, a semi-symmetrical coefficient configuration with negation on the high taps, a semi-symmetrical coefficient configuration with negation on the low taps, and for each of these whether shifting is to be performed on the output, etc.). Many different combinations of whether to dedicate an FIR filter operation to an opcode or allow an opcode to be used for different FIR filter operations are contemplated.

Figure 7:
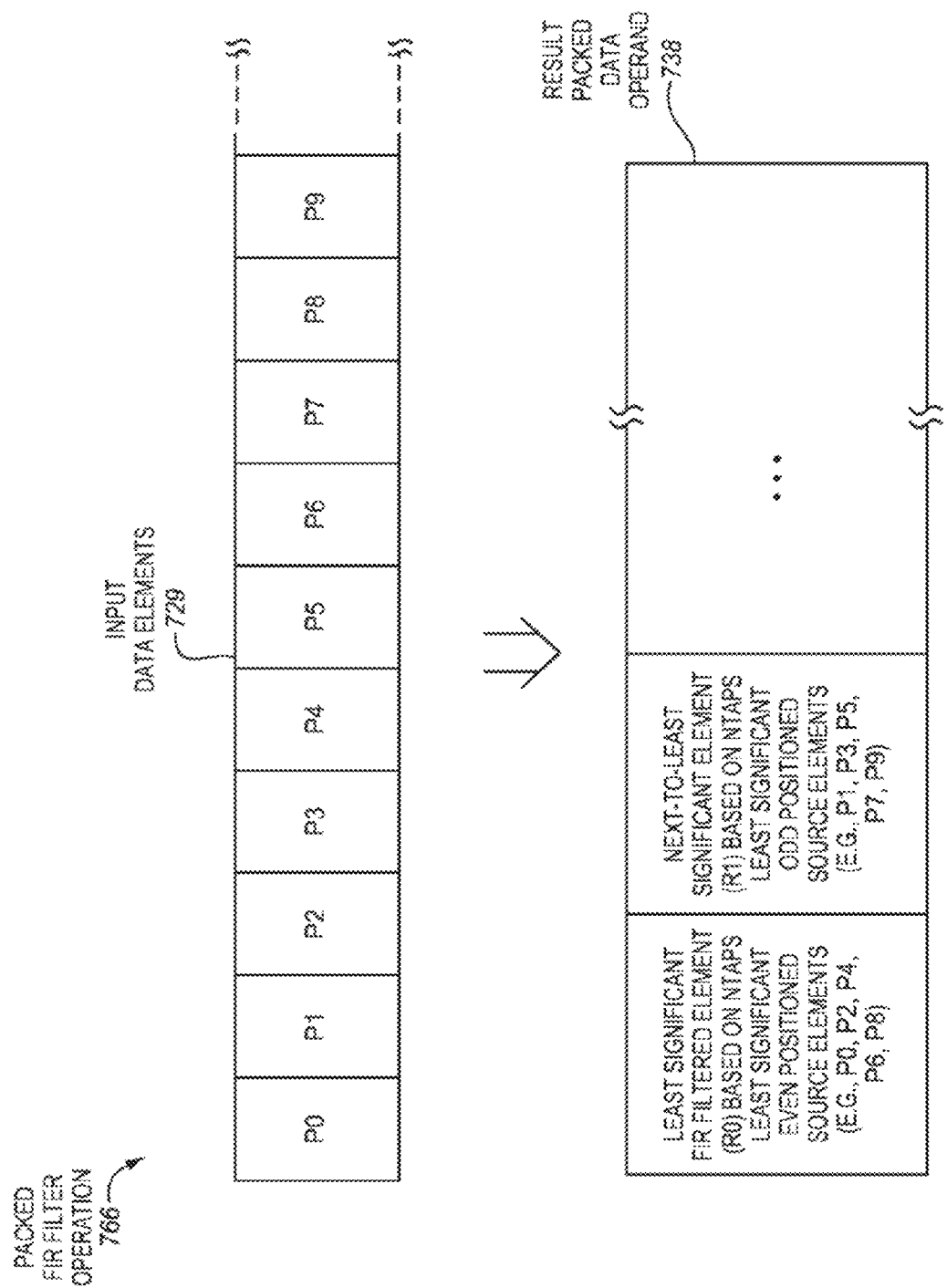
FIG. 7 is a block diagram of an example embodiment of a packed FIR filter operation in which FIR filtered result data elements are generated based on FIR filtering on corresponding sets of alternating non-contiguous source data element.

FIG. 7 is a block diagram of an example embodiment of a packed FIR filter operation 766 in which FIR filtered result data elements are generated based on FIR filtering on corresponding sets of every other or alternating source data element. By way of example, this may be useful in polyphase FIR filtering. The operation may be performed in response to an embodiment of a packed FIR filter instruction. The instruction may indicate a set of input data elements 729 includes data elements P0 through P9. A result packed data operand 738 may be generated due to the packed FIR filter operation.

The result packed data operand includes a first (e.g., least or most significant) even positioned FIR filtered result data element R0 that is based on FIR filtering on the number of the FIR filter taps (NTAPS) of (e.g., least or most significant) only even positioned data elements (e.g., P0, P2, P4, P6, and P8). The FIR filtered result data element R0 is not based on FIR filtering performed using the odd positioned source data elements (e.g., P1, P3, P5, P7, and P9). This may be achieved by an input interconnection or selection network that skips pixel positions between taps.

The result packed data operand also includes a second (e.g., next-to-least or next-to-most significant) odd positioned FIR filtered result data element R1 that is based on FIR filtering on the number of the FIR filter taps (NTAPS) of (e.g., least or most significant) only odd positioned data elements (e.g., P1, P3, P5, P7, and P9). The FIR filtered result data element R1 is not based on FIR filtering performed using the even positioned source data elements (e.g., P0, P2, P4, P6, and P8). This may be achieved by an input interconnection or selection network that skips pixel positions between taps.

Similarly, other even positioned FIR filtered result data elements may be based on FIR filtering only even positioned source data elements, and other odd positioned FIR filtered result data elements may be based on FIR filtering only odd positioned source data elements. Such embodiments may allow sparse filters to be employed. Representatively, such embodiments may be useful for decimation, or interleaved planes. Such input data arrangements may be used with various different types of filters having various different numbers of taps and coefficients. Other embodiments may more generally use such polyphase FIR filtering by taking every Nth elements instead of every other or alternate element.

FIG. 8 is a block diagram of an embodiment of an example embodiment of a packed FIR filter instruction 822. The instruction includes an operation code or opcode 870.

The opcode may represent a plurality of bits or one or more fields that are operable to identify the instruction and/or the operation to be performed (e.g., a packed FIR filter operation). As mentioned above, in some embodiments the opcode may implicitly indicate a fixed configuration in which the coefficients are to be used (e.g., a symmetrical or semi-symmetrical configuration), whereas in other embodiments it may not (e.g., non-opcode set of bits may specify or select the configuration).

The instruction also includes a first source specification field 871 to explicitly specify a location of a first source packed data operand, an optional second source specification field 872 to explicitly specify a location of an optional second source packed data operand, an optional destination specification field 873 to explicitly specify a destination location where a result packed data operand is to be stored. By way of example, each of these fields may include an address of a register, memory location, or other storage location. Alternatively, as previously mentioned, the storage location(s) of one or more of the first source packed data operand, the second source packed data operand, or the destination may optionally be implicit to the instruction, as opposed to being explicitly specified. In one aspect, an implicit source/destination storage location may optionally be used. Also, in other embodiments, the instruction may specify a single source operand, or more than two.

In some embodiments, the instruction may also have an optional immediate 874 to provide a plurality of input parameters. In some embodiments, the immediate may provide a plurality of coefficients and/or one or more of a shift amount and/or sign inversion controls. Alternatively, the input parameters may be provided by a register or other storage location that is either explicitly specified by the instruction (e.g., with another source specification field (not shown)) or that is implicit to the instruction. In some embodiments, the instruction may optionally have a third source specification field 875 to provide one or more additional input parameters. Alternatively, an implicit register or other storage location may optionally be used to provide these additional input parameters.

The illustration shows examples of the types of fields that may be included in an embodiment of a packed FIR filter instruction. Alternate embodiments may include a subset of the illustrated fields or may add additional fields. The illustrated order/arrangement of the fields is not required, but rather the fields may be rearranged. Fields need not include contiguous sequences of bits but rather may be composed of non-contiguous or separated bits.

FIG. 9 is a block diagram of an example embodiment of a 32-bit operand 978 of a packed FIR filter instruction that may be used to provide three coefficients (C0 through C2), an optional shift amount 954, and an optional set of sign inversion controls 980. In some embodiments, the operand may be a 32-bit immediate of the instruction. In other embodiments, the operand may be stored in a 32-bit general-purpose or other register indicated by the instruction. In some embodiments, each of the coefficients may optionally be provided in a different corresponding byte of the operand and may be byte aligned, which may help to provide efficient byte access and readability. For example, as shown a first coefficient C0 may be provided in a least significant byte, a second coefficient C1 may be provided in a second least significant byte, and a third coefficient C2 may be provided in a third least significant byte. Byte alignment offers advantages but is not required. In the illustrated embodiment, each of these coefficients is a 5-bit coefficient, although in other embodiments the coefficients may have fewer or more bits (e.g., often from 4-bits to 8-bits). The coefficients may optionally have other attributes described herein (e.g., in conjunction with the coefficients 234), such as, for example, the internal floating point formats, etc. In some embodiments, the associated instruction (e.g., an opcode, an opcode with another field, etc.) may indicate how the coefficients are to be used (e.g., used as independent coefficients, used in a symmetrical configuration, used in a semi-symmetrical configuration) as previously described.

As shown, in some embodiments, the operand may also optionally provide an optional shift amount 954 and an optional set of sign inversion controls 980. In the illustrated embodiment, these are both provided in a most significant byte of the operand. Specifically, the shift amount is provided in a least significant three bits of the most significant byte, and the set of sign inversion controls are provided in a most significant five bits of the most significant byte. The three bits used for the shift amount are sufficient to represent shifts ranging from 0 to 7 bits. Each of the five bits of the set of sign inversion controls may correspond to a different one of five taps and may be used to either enable or disable sign inversion for the corresponding tap. In other embodiments, fewer or more than five bits may optionally be used for the set of sign inversion controls and/or fewer or more than three bits may be used for the shift amount.

Figure 10A:
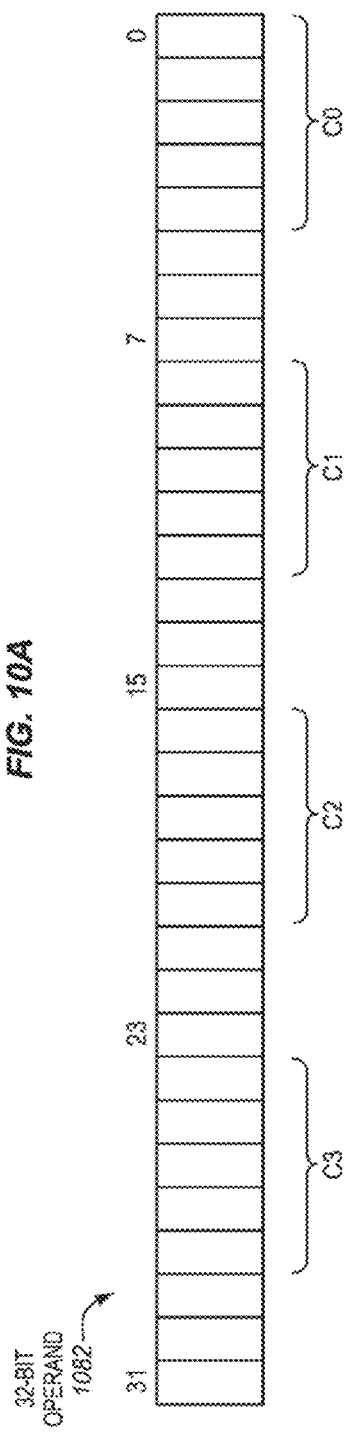
FIG. 10A is a block diagram of an example embodiment of a 32-bit operand that provides four FIR filter coefficients.

FIG. 10A is a block diagram of an example embodiment of a 32-bit operand 1082 of a packed FIR filter instruction that may be used to provide four coefficients (C0 through C3). In some embodiments, the operand may be a 32-bit immediate of the instruction. In other embodiments, the operand may be stored in a 32-bit general-purpose or other register indicated by the instruction. In some embodiments, each of the coefficients may optionally be provided in a different corresponding byte of the operand and may be byte aligned, which may help to provide efficient byte access and readability. For example, as shown a first coefficient C0 may be provided in a least significant byte, a second coefficient C1 may be provided in a second least significant byte, and a third coefficient C2 may be provided in a third least significant byte, and a fourth coefficient C3 may be provided in a most significant byte. Alternatively, these coefficients may optionally be rearranged variously within the operand. Byte alignment offers advantages but is not required. In the illustrated embodiment, each of these coefficients is a 5-bit coefficient, although in other embodiments the coefficients may have fewer or more bits (e.g., often from 4-bits to 8-bits). The coefficients may optionally have other attributes described herein (e.g., in conjunction with the coefficients 234), such as, for example, the internal floating point formats, etc. In some embodiments, the associated instruction (e.g., an opcode, an opcode with another field, etc.) may indicate how the coefficients are to be used (e.g., used as independent coefficients, used in a symmetrical configuration, used in a semi-symmetrical configuration) as previously described.

Figure 10B:
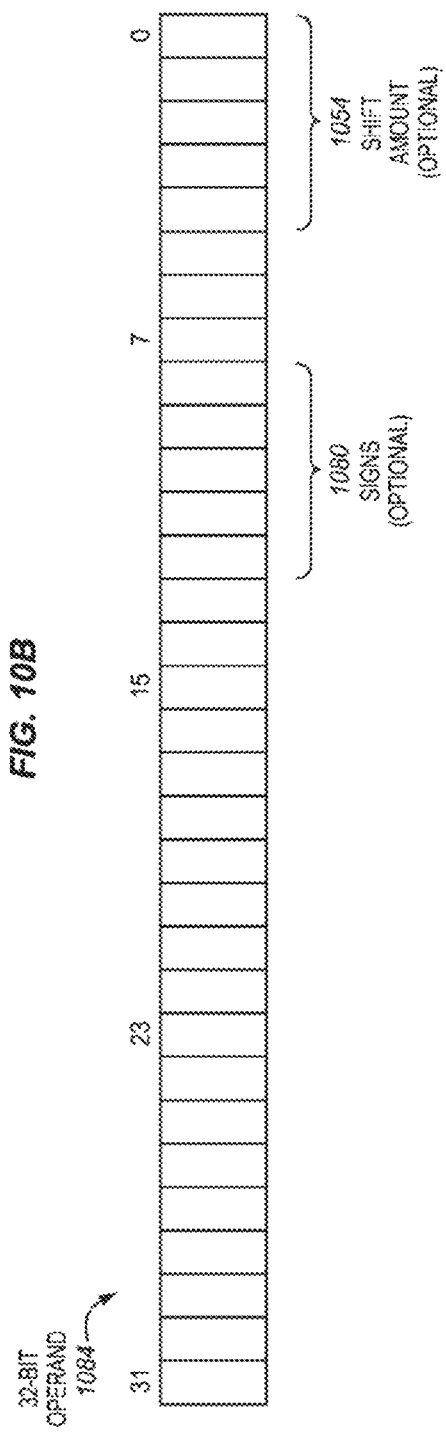
FIG. 10B is a block diagram of an example embodiment of a 32-bit operand that may be used together with the 32-bit operand of FIG. 10A and that provides one or more additional input parameters.

FIG. 10B is a block diagram of an example embodiment of a 32-bit operand 1084 of a packed FIR filter instruction that may be used together with the 32-bit operand of FIG. 10A and may be used to provide one or more additional input parameters. In some embodiments, the operand may be a 32-bit general-purpose or other register indicated by the instruction. In the illustrated example embodiment, the operand optionally provides a shift amount 1054 and optional sign inversion controls 1080. As shown, in some embodiments, the input parameters may optionally be provided in different corresponding bytes of the operand and may be byte aligned. Byte alignment offers advantages but is not required. As shown, the shift amount may optionally be provided in a least significant byte and 5-bits of sign inversion control may optionally be provided in a next least significant byte. In other embodiments, the operand may optionally omit one or both of these input parameters and/or may provide other input parameters (e.g., one or more additional coefficients).

It is to be appreciated that FIGS. 9 and 10A-B illustrate just a few illustrative ways in which coefficients and other input parameters may be provided in one or more 32-bit operands. In other embodiments, the coefficients and other input parameters may optionally be rearranged variously within the one or more operands. In still other embodiments, one or both of the shift amount and the sign inversion controls may optionally be omitted. In other embodiments, either wider or narrower operands may optionally be used, such as, for example, 16-bit operands, 64-bit operands, or the like. Moreover, the fields need not consist of a contiguous sequence of bits, but rather non-contiguous or separated bits may optionally be used to represent a coefficient or other input parameter.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 11A is a block diagram illustrating both an exemplary in-order pipeline and an exemplary register renaming, out-of-order issue/execution pipeline according to embodiments of the invention. FIG. 11B is a block diagram illustrating both an exemplary embodiment of an in-order architecture core and an exemplary register renaming, out-of-order issue/execution architecture core to be included in a processor according to embodiments of the invention. The solid lined boxes in FIGS. 11A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 11A, a processor pipeline 1100 includes a fetch stage 1102, a length decode stage 1104, a decode stage 1106, an allocation stage 1108, a renaming stage 1110, a scheduling (also known as a dispatch or issue) stage 1112, a register read/memory read stage 1114, an execute stage 1116, a write back/memory write stage 1118, an exception handling stage 1122, and a commit stage 1124.

FIG. 11B shows processor core 1190 including a front end unit 1130 coupled to an execution engine unit 1150, and both are coupled to a memory unit 1170. The core 1190 may be a reduced instruction set computing (RISC) core, a complex instruction set computing (CISC) core, a very long instruction word (VLIW) core, or a hybrid or alternative core type. As yet another option, the core 1190 may be a special-purpose core, such as, for example, a network or communication core, compression engine, coprocessor core, general purpose computing graphics processing unit (GPGPU) core, graphics core, or the like.

The front end unit 1130 includes a branch prediction unit 1132 coupled to an instruction cache unit 1134, which is coupled to an instruction translation lookaside buffer (TLB) 1136, which is coupled to an instruction fetch unit 1138, which is coupled to a decode unit 1140. The decode unit 1140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1190 includes a microcode ROM or other medium that stores microcode for certain macroinstructions (e.g., in decode unit 1140 or otherwise within the front end unit 1130). The decode unit 1140 is coupled to a rename/allocator unit 1152 in the execution engine unit 1150.

The execution engine unit 1150 includes the rename/allocator unit 1152 coupled to a retirement unit 1154 and a set of one or more scheduler unit(s) 1156. The scheduler unit(s) 1156 represents any number of different schedulers, including reservations stations, central instruction window, etc. The scheduler unit(s) 1156 is coupled to the physical register file(s) unit(s) 1158. Each of the physical register file(s) units 1158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1158 comprises a vector registers unit, a write mask registers unit, and a scalar registers unit. These register units may provide architectural vector registers, vector mask registers, and general purpose registers. The physical register file(s) unit(s) 1158 is overlapped by the retirement unit 1154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1154 and the physical register file(s) unit(s) 1158 are coupled to the execution cluster(s) 1160. The execution cluster(s) 1160 includes a set of one or more execution units 1162 and a set of one or more memory access units 1164. The execution units 1162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1156, physical register file(s) unit(s) 1158, and execution cluster(s) 1160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1164). It should also be understood that where separate pipelines are used, one or more of these pipelines may be out-of-order issue/execution and the rest in-order.

The set of memory access units 1164 is coupled to the memory unit 1170, which includes a data TLB unit 1172 coupled to a data cache unit 1174 coupled to a level 2 (L2) cache unit 1176. In one exemplary embodiment, the memory access units 1164 may include a load unit, a store address unit, and a store data unit, each of which is coupled to the data TLB unit 1172 in the memory unit 1170. The instruction cache unit 1134 is further coupled to a level 2 (L2) cache unit 1176 in the memory unit 1170. The L2 cache unit 1176 is coupled to one or more other levels of cache and eventually to a main memory.

By way of example, the exemplary register renaming, out-of-order issue/execution core architecture may implement the pipeline 1100 as follows: 1) the instruction fetch 1138 performs the fetch and length decoding stages 1102 and 1104; 2) the decode unit 1140 performs the decode stage 1106; 3) the rename/allocator unit 1152 performs the allocation stage 1108 and renaming stage 1110; 4) the scheduler unit(s) 1156 performs the schedule stage 1112; 5) the physical register file(s) unit(s) 1158 and the memory unit 1170 perform the register read/memory read stage 1114; the execution cluster 1160 perform the execute stage 1116; 6) the memory unit 1170 and the physical register file(s) unit(s) 1158 perform the write back/memory write stage 1118; 7) various units may be involved in the exception handling stage 1122; and 8) the retirement unit 1154 and the physical register file(s) unit(s) 1158 perform the commit stage 1124.

The core 1190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1190 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1134/1174 and a shared L2 cache unit 1176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 12B:
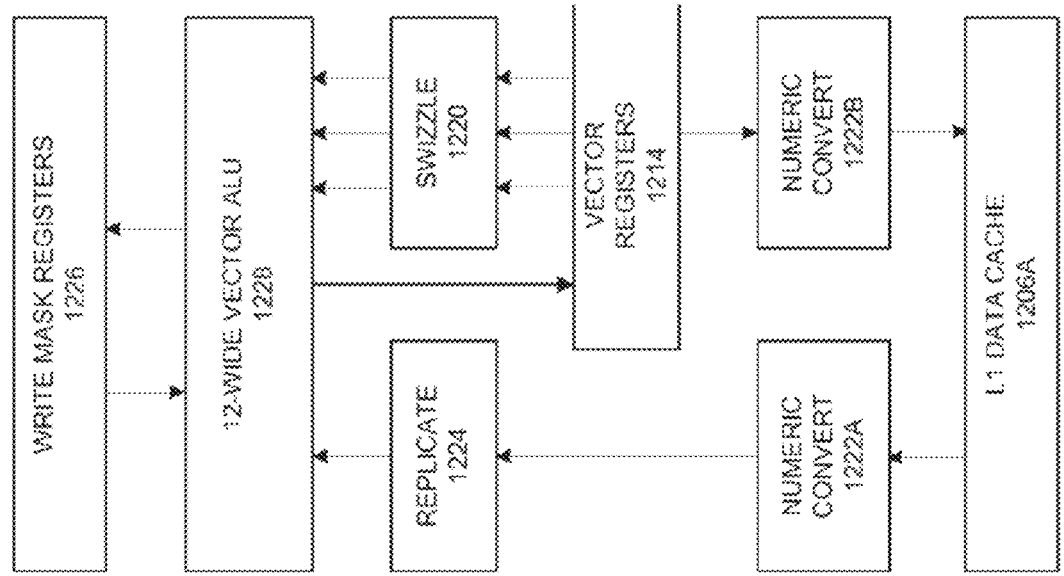
FIG. 12B is a block diagram of an embodiment of an expanded view of part of the processor core of FIG. 12A.
Figure 12A:
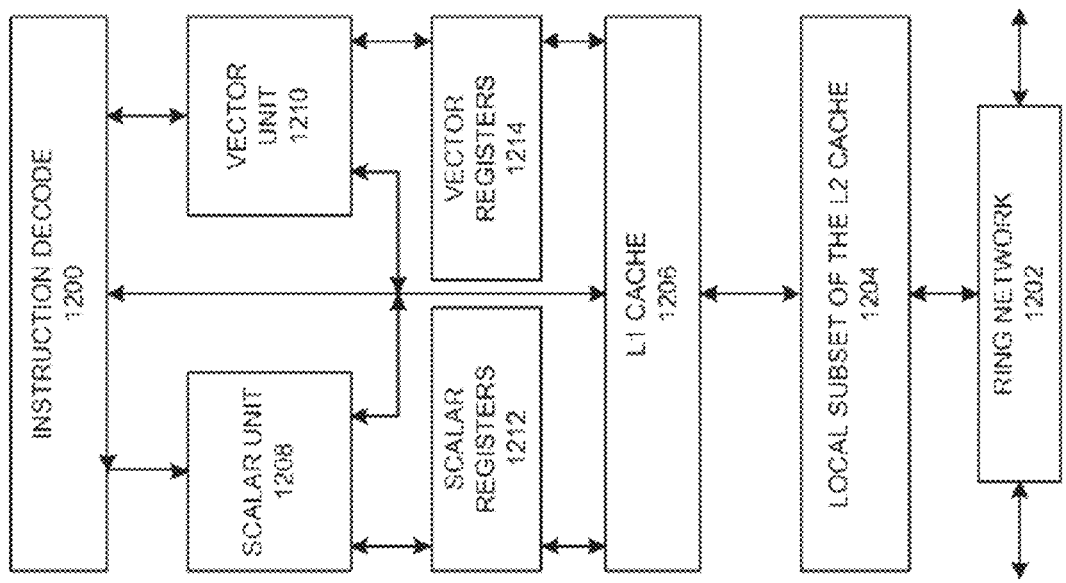
FIG. 12A is a block diagram of an embodiment of a single processor core, along with its connection to the on-die interconnect network, and with its local subset of the Level 2 (L2) cache.

FIGS. 12A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 12A is a block diagram of a single processor core, along with its connection to the on-die interconnect network 1202 and with its local subset of the Level 2 (L2) cache 1204, according to embodiments of the invention. In one embodiment, an instruction decoder 1200 supports the x86 instruction set with a packed data instruction set extension. An L1 cache 1206 allows low-latency accesses to cache memory into the scalar and vector units. While in one embodiment (to simplify the design), a scalar unit 1208 and a vector unit 1210 use separate register sets (respectively, scalar registers 11212 and vector registers 1214) and data transferred between them is written to memory and then read back in from a level 1 (L1) cache 1206, alternative embodiments of the invention may use a different approach (e.g., use a single register set or include a communication path that allow data to be transferred between the two register files without being written and read back).

The local subset of the L2 cache 1204 is part of a global L2 cache that is divided into separate local subsets, one per processor core. Each processor core has a direct access path to its own local subset of the L2 cache 1204. Data read by a processor core is stored in its L2 cache subset 1204 and can be accessed quickly, in parallel with other processor cores accessing their own local L2 cache subsets. Data written by a processor core is stored in its own L2 cache subset 1204 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 12B is an expanded view of part of the processor core in FIG. 12A according to embodiments of the invention. FIG. 12B includes an L1 data cache 1206A part of the L1 cache 1204, as well as more detail regarding the vector unit 1210 and the vector registers 1214. Specifically, the vector unit 1210 is a 16-wide vector processing unit (VPU) (see the 16-wide ALU 1228), which executes one or more of integer, single-precision float, and double-precision float instructions. The VPU supports swizzling the register inputs with swizzle unit 1220, numeric conversion with numeric convert units 1222A-B, and replication with replication unit 1224 on the memory input. Write mask registers 1226 allow predicating resulting vector writes.

Processor with Integrated Memory Controller and Graphics

Figure 13:
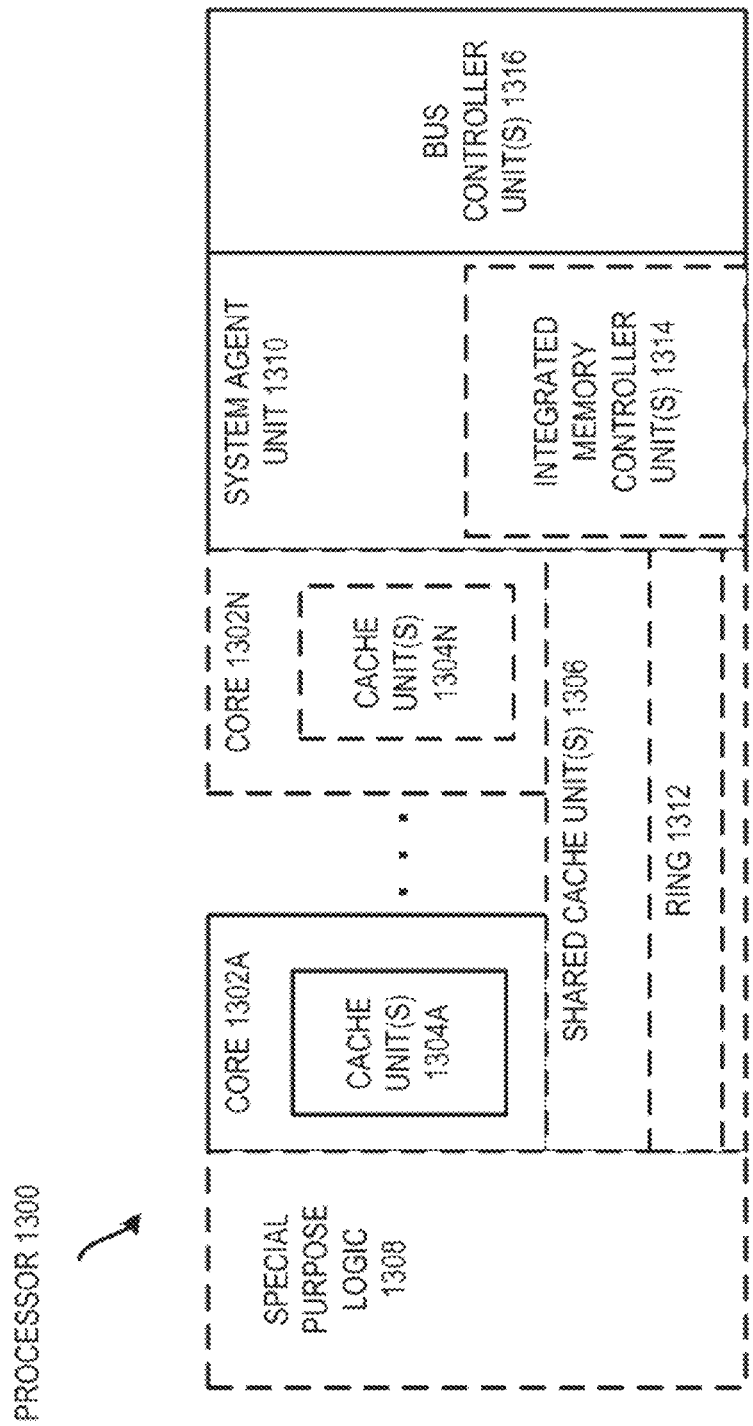
FIG. 13 is a block diagram of an embodiment of a processor that may have more than one core, may have an integrated memory controller, and may have integrated graphics.

FIG. 13 is a block diagram of a processor 1300 that may have more than one core, may have an integrated memory controller, and may have integrated graphics according to embodiments of the invention. The solid lined boxes in FIG. 13 illustrate a processor 1300 with a single core 1302A, a system agent 1310, a set of one or more bus controller units 1316, while the optional addition of the dashed lined boxes illustrates an alternative processor 1300 with multiple cores 1302A-N, a set of one or more integrated memory controller unit(s) 1314 in the system agent unit 1310, and special purpose logic 1308.

Thus, different implementations of the processor 1300 may include: 1) a CPU with the special purpose logic 1308 being integrated graphics and/or scientific (throughput) logic (which may include one or more cores), and the cores 1302A-N being one or more general purpose cores (e.g., general purpose in-order cores, general purpose out-of-order cores, a combination of the two); 2) a coprocessor with the cores 1302A-N being a large number of special purpose cores intended primarily for graphics and/or scientific (throughput); and 3) a coprocessor with the cores 1302A-N being a large number of general purpose in-order cores. Thus, the processor 1300 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1300 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1306, and external memory (not shown) coupled to the set of integrated memory controller units 1314. The set of shared cache units 1306 may include one or more mid-level caches, such as level 2 (L2), level 3 (L3), level 4 (L4), or other levels of cache, a last level cache (LLC), and/or combinations thereof. While in one embodiment a ring based interconnect unit 1312 interconnects the integrated graphics logic 1308, the set of shared cache units 1306, and the system agent unit 1310/integrated memory controller unit(s) 1314, alternative embodiments may use any number of well-known techniques for interconnecting such units. In one embodiment, coherency is maintained between one or more cache units 1306 and cores 1302-A-N.

In some embodiments, one or more of the cores 1302A-N are capable of multi-threading. The system agent 1310 includes those components coordinating and operating cores 1302A-N. The system agent unit 1310 may include for example a power control unit (PCU) and a display unit. The PCU may be or include logic and components needed for regulating the power state of the cores 1302A-N and the integrated graphics logic 1308. The display unit is for driving one or more externally connected displays.

The cores 1302A-N may be homogenous or heterogeneous in terms of architecture instruction set; that is, two or more of the cores 1302A-N may be capable of execution the same instruction set, while others may be capable of executing only a subset of that instruction set or a different instruction set.

Exemplary Computer Architectures

FIGS. 14-21 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 14:
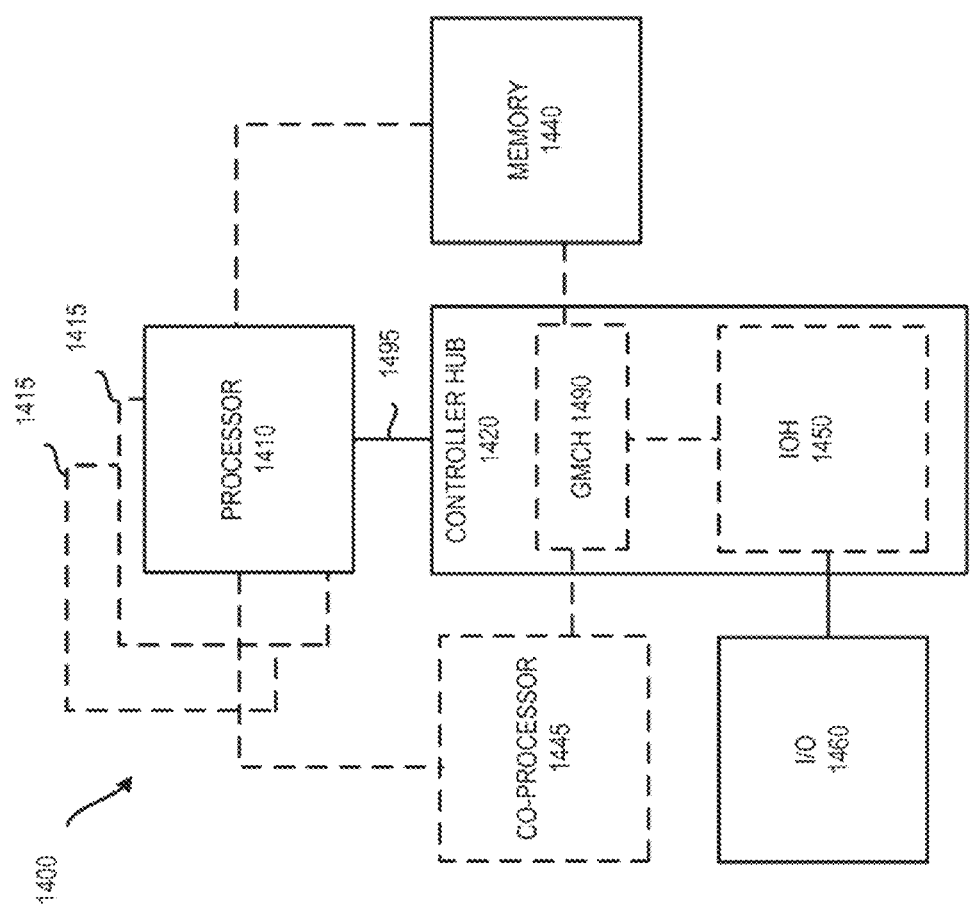
FIG. 14 is a block diagram of a first embodiment of a computer architecture.

Referring now to FIG. 14, shown is a block diagram of a system 1400 in accordance with one embodiment of the present invention. The system 1400 may include one or more processors 1410, 1415, which are coupled to a controller hub 1420. In one embodiment the controller hub 1420 includes a graphics memory controller hub (GMCH) 1490 and an Input/Output Hub (IOH) 1450 (which may be on separate chips); the GMCH 1490 includes memory and graphics controllers to which are coupled memory 1440 and a coprocessor 1445; the IOH 1450 is couples input/output (I/O) devices 1460 to the GMCH 1490. Alternatively, one or both of the memory and graphics controllers are integrated within the processor (as described herein), the memory 1440 and the coprocessor 1445 are coupled directly to the processor 1410, and the controller hub 1420 in a single chip with the IOH 1450.

The optional nature of additional processors 1415 is denoted in FIG. 14 with broken lines. Each processor 1410, 1415 may include one or more of the processing cores described herein and may be some version of the processor 1300.

The memory 1440 may be, for example, dynamic random access memory (DRAM), phase change memory (PCM), or a combination of the two. For at least one embodiment, the controller hub 1420 communicates with the processor(s) 1410, 1415 via a multi-drop bus, such as a frontside bus (FSB), point-to-point interface such as QuickPath Interconnect (QPI), or similar connection 1495.

In one embodiment, the coprocessor 1445 is a special-purpose processor, such as, for example, a high-throughput MIC processor, a network or communication processor, compression engine, graphics processor, GPGPU, embedded processor, or the like. In one embodiment, controller hub 1420 may include an integrated graphics accelerator.

There can be a variety of differences between the physical resources 1410, 1415 in terms of a spectrum of metrics of merit including architectural, microarchitectural, thermal, power consumption characteristics, and the like.

In one embodiment, the processor 1410 executes instructions that control data processing operations of a general type. Embedded within the instructions may be coprocessor instructions. The processor 1410 recognizes these coprocessor instructions as being of a type that should be executed by the attached coprocessor 1445. Accordingly, the processor 1410 issues these coprocessor instructions (or control signals representing coprocessor instructions) on a coprocessor bus or other interconnect, to coprocessor 1445. Coprocessor(s) 1445 accept and execute the received coprocessor instructions.

Figure 15:
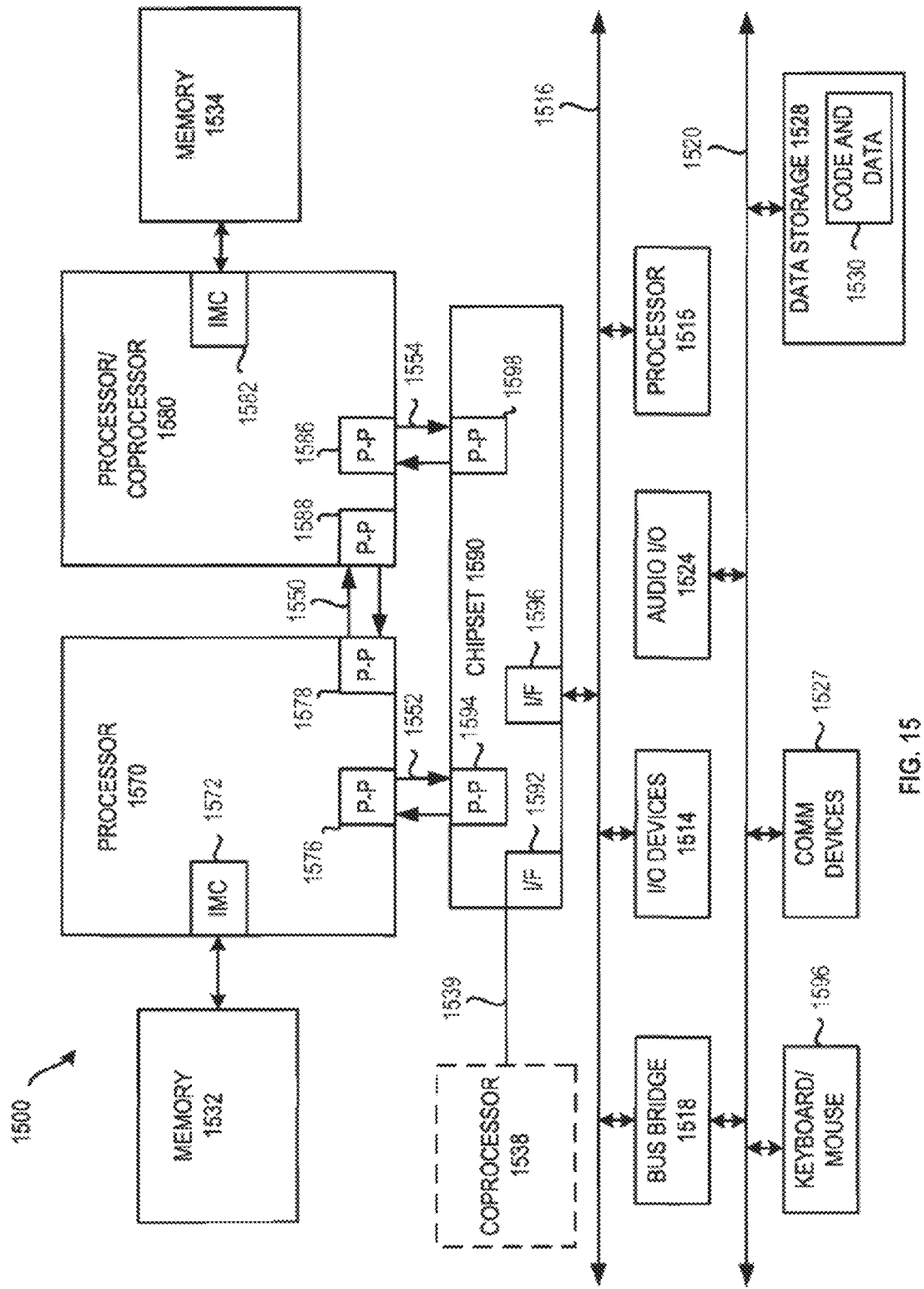
FIG. 15 is a block diagram of a second embodiment of a computer architecture.

Referring now to FIG. 15, shown is a block diagram of a first more specific exemplary system 1500 in accordance with an embodiment of the present invention. As shown in FIG. 15, multiprocessor system 1500 is a point-to-point interconnect system, and includes a first processor 1570 and a second processor 1580 coupled via a point-to-point interconnect 1550. Each of processors 1570 and 1580 may be some version of the processor 1300. In one embodiment of the invention, processors 1570 and 1580 are respectively processors 1410 and 1415, while coprocessor 1538 is coprocessor 1445. In another embodiment, processors 1570 and 1580 are respectively processor 1410 coprocessor 1445.

Processors 1570 and 1580 are shown including integrated memory controller (IMC) units 1572 and 1582, respectively. Processor 1570 also includes as part of its bus controller units point-to-point (P-P) interfaces 1576 and 1578; similarly, second processor 1580 includes P-P interfaces 1586 and 1588. Processors 1570, 1580 may exchange information via a point-to-point (P-P) interface 1550 using P-P interface circuits 1578, 1588. As shown in FIG. 15, IMCs 1572 and 1582 couple the processors to respective memories, namely a memory 1532 and a memory 1534, which may be portions of main memory locally attached to the respective processors.

Processors 1570, 1580 may each exchange information with a chipset 1590 via individual P-P interfaces 1552, 1554 using point to point interface circuits 1576, 1594, 1586, 1598. Chipset 1590 may optionally exchange information with the coprocessor 1538 via a high-performance interface 1539. In one embodiment, the coprocessor 1538 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1590 may be coupled to a first bus 1516 via an interface 1596. In one embodiment, first bus 1516 may be a Peripheral Component Interconnect (PCI) bus, or a bus such as a PCI Express bus or another third generation I/O interconnect bus, although the scope of the present invention is not so limited.

As shown in FIG. 15, various I/O devices 1514 may be coupled to first bus 1516, along with a bus bridge 1518 which couples first bus 1516 to a second bus 1520. In one embodiment, one or more additional processor(s) 1515, such as coprocessors, high-throughput MIC processors, GPGPU's, accelerators (such as, e.g., graphics accelerators or digital signal processing (DSP) units), field programmable gate arrays, or any other processor, are coupled to first bus 1516. In one embodiment, second bus 1520 may be a low pin count (LPC) bus. Various devices may be coupled to a second bus 1520 including, for example, a keyboard and/or mouse 1522, communication devices 1527 and a storage unit 1528 such as a disk drive or other mass storage device which may include instructions/code and data 1530, in one embodiment. Further, an audio I/O 1524 may be coupled to the second bus 1520. Note that other architectures are possible. For example, instead of the point-to-point architecture of FIG. 15, a system may implement a multi-drop bus or other such architecture.

Figure 16:
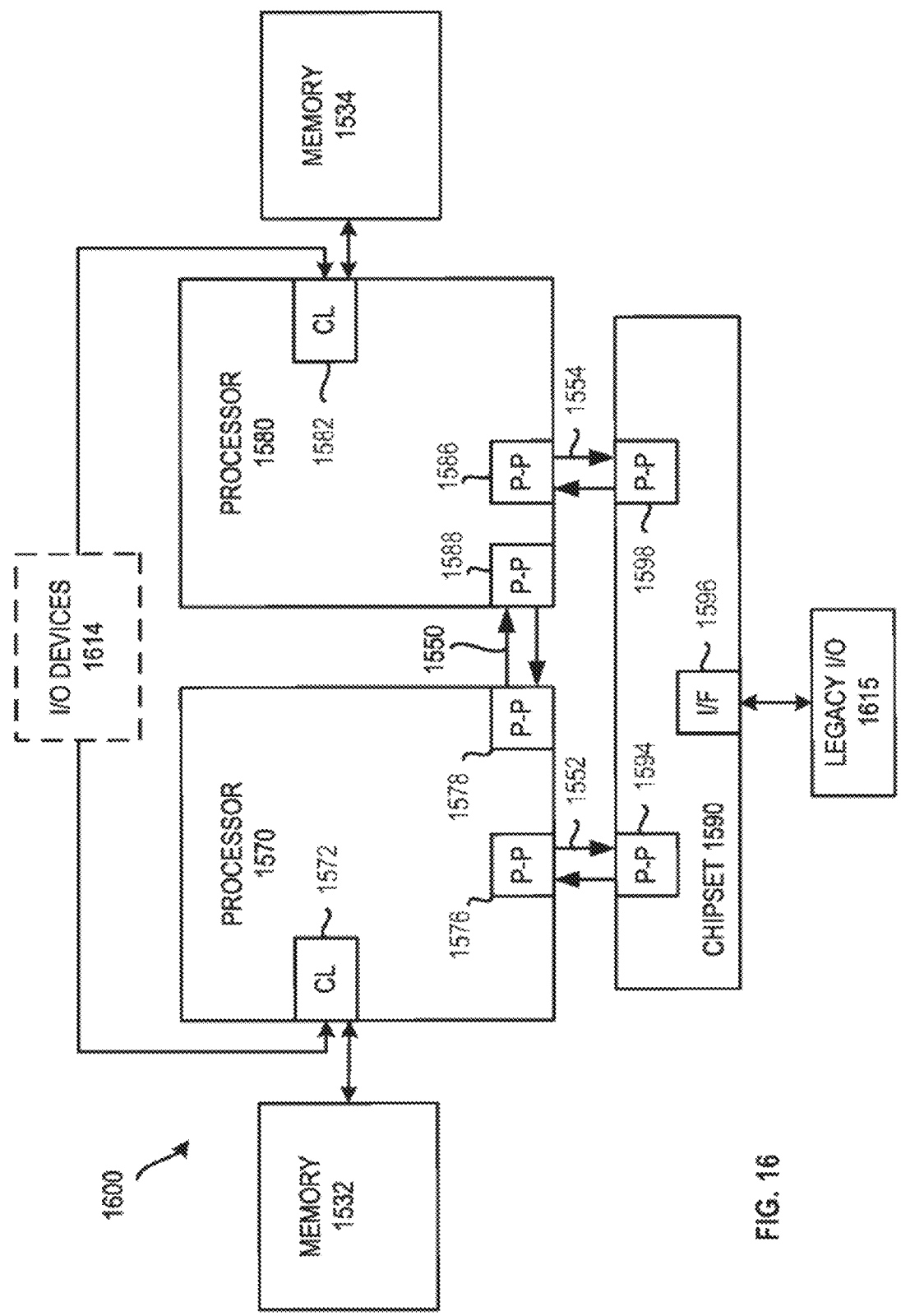
FIG. 16 is a block diagram of a third embodiment of a computer architecture.

Referring now to FIG. 16, shown is a block diagram of a second more specific exemplary system 1600 in accordance with an embodiment of the present invention. Like elements in FIGS. 15 and 16 bear like reference numerals, and certain aspects of FIG. 15 have been omitted from FIG. 16 in order to avoid obscuring other aspects of FIG. 16.

FIG. 16 illustrates that the processors 1570, 1580 may include integrated memory and I/O control logic ("CL")

1572 and 1582, respectively. Thus, the CL 1572, 1582 include integrated memory controller units and include I/O control logic. FIG. 16 illustrates that not only are the memories 1532, 1534 coupled to the CL 1572, 1582, but also that I/O devices 1614 are also coupled to the control logic 1572, 1582. Legacy I/O devices 1615 are coupled to the chipset 1590.

Figure 17:
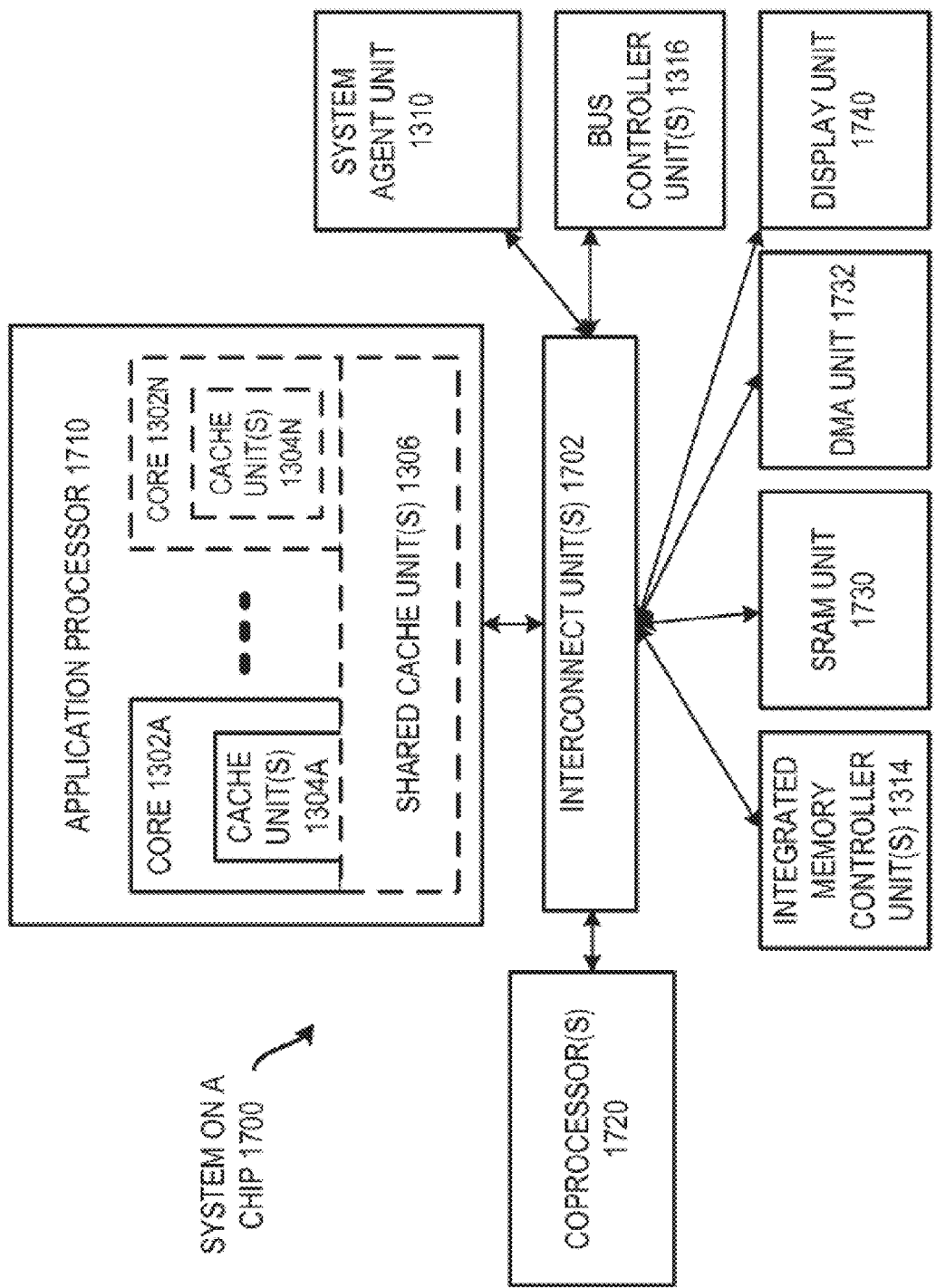
FIG. 17 is a block diagram of a fourth embodiment of a computer architecture.

Referring now to FIG. 17, shown is a block diagram of a SoC 1700 in accordance with an embodiment of the present invention. Similar elements in FIG. 13 bear like reference numerals. Also, dashed lined boxes are optional features on more advanced SoCs. In FIG. 17, an interconnect unit(s) 1702 is coupled to: an application processor 1710 which includes a set of one or more cores 162A-N and shared cache unit(s) 1306; a system agent unit 1310; a bus controller unit(s) 1316; an integrated memory controller unit(s) 1314; a set or one or more coprocessors 1720 which may include integrated graphics logic, an image processor, an audio processor, and a video processor; an static random access memory (SRAM) unit 1730; a direct memory access (DMA) unit 1732; and a display unit 1740 for coupling to one or more external displays. In one embodiment, the coprocessor(s) 1720 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1530 illustrated in FIG. 15, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 18:
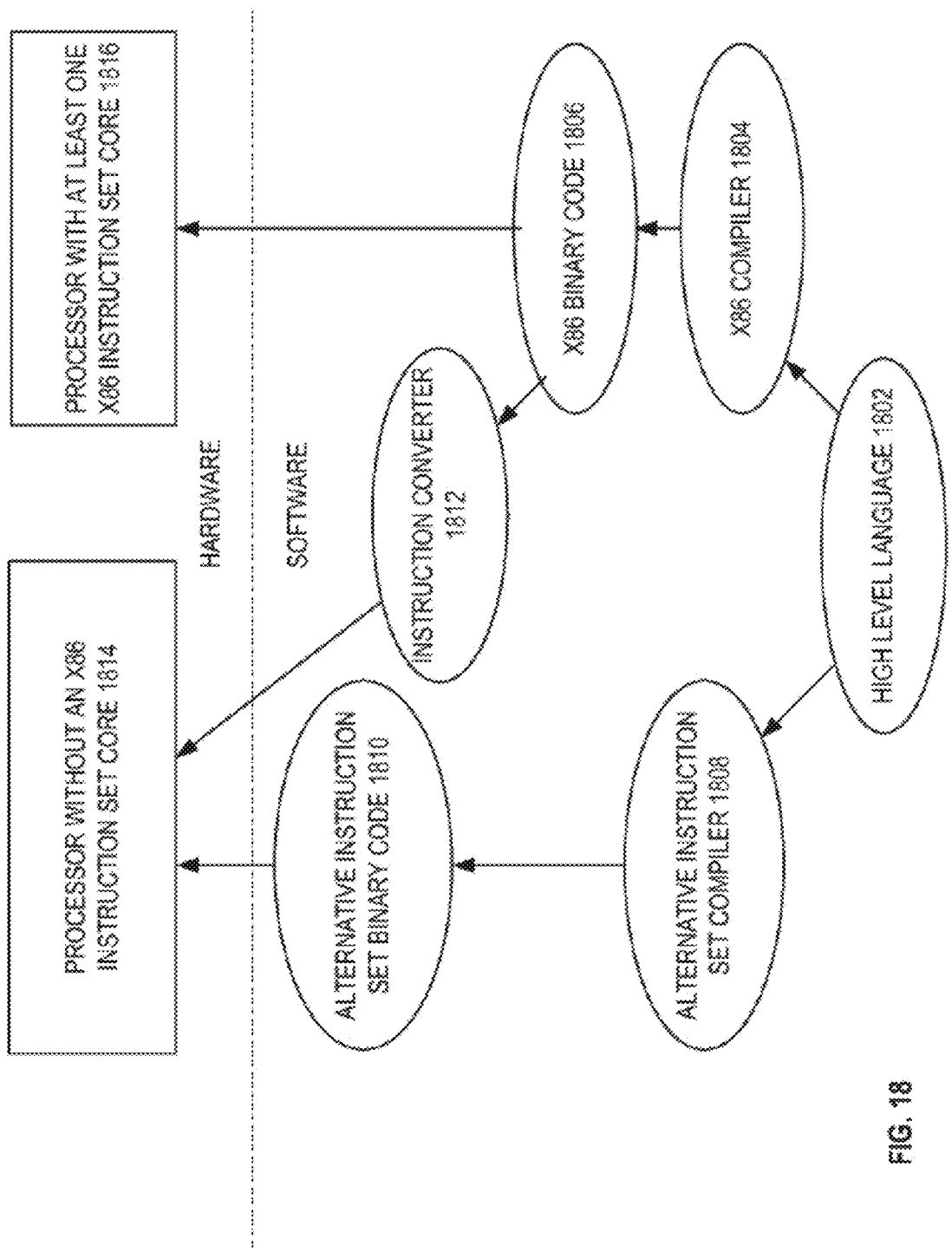
FIG. 18 is a block diagram of use of a software instruction converter to convert binary instructions in a source instruction set to binary instructions in a target instruction set, according to embodiments of the invention.

FIG. 18 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 18 shows a program in a high level language 1802 may be compiled using an x86 compiler 1804 to generate x86 binary code 1806 that may be natively executed by a processor with at least one x86 instruction set core 1816. The processor with at least one x86 instruction set core 1816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1804 represents a compiler that is operable to generate x86 binary code 1806 (e.g., object code) that can, with or without additional linkage processing, be executed on the processor with at least one x86 instruction set core 1816. Similarly, FIG. 18 shows the program in the high level language 1802 may be compiled using an alternative instruction set compiler 1808 to generate alternative instruction set binary code 1810 that may be natively executed by a processor without at least one x86 instruction set core 1814 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1812 is used to convert the x86 binary code 1806 into code that may be natively executed by the processor without an x86 instruction set core 1814. This converted code is not likely to be the same as the alternative instruction set binary code 1810 because an instruction converter capable of this is difficult to make; however, the converted code will accomplish the general operation and be made up of instructions from the alternative instruction set. Thus, the instruction converter 1812 represents software, firmware, hardware, or a combination thereof that, through emulation, simulation or any other process, allows a processor or other electronic device that does not have an x86 instruction set processor or core to execute the x86 binary code 1806.

Apparatus and Method for Performing Horizontal Filter Operations

As mentioned, convolutions and finite impulse response (FIR) filters are essential part for image processing and deep learning. In deep learning convolutions are the main processing workload and are typically performed on massively parallel hardware such as a GPU or a dedicated convolution accelerator.

When the convolutions are just a part of a more complex algorithm they are often performed on a general purpose processor or a digital signal processor (DSP). Single-instruction multiple-data (SIMD) processing may then be used to speed up the computation where a convolution is performed in three steps: data alignment, multiplication and result accumulation. Dedicated instructions to merge these three steps efficiently are highly valuable to increase the processing speed on DSPs or CPUs.

The main hardware element in designing a convolution instruction functional unit is a multiplier. The embodiments of the invention address various use cases and provide a rich set of instructions that can be realized by efficiently reusing the multiplier hardware. The disclosed instructions enable higher processing performance and the provided microarchitectural design patters enable low silicon area solution.

The description above associated with FIGS. 1-10B includes embodiments for accelerating horizontal convolutions for vector data and efficient design for symmetric and asymmetric filters. One embodiment of the invention includes various extensions that are not found in any of the previous solutions described above including (1) SIMD data blending instructions; (2) vertical SIMD FIR filter instructions; (3) SIMD instructions for larger horizontal filters using pre-aligning and accumulate; and (4) block data SIMD filtering instructions. Each of these extensions will be briefly described followed by a description of more detailed implementations of the invention.

Moreover, the circuitry and logic to perform the various instructions and operations described herein may be integrated within the execution engine unit 1150 shown in FIG. 11B, within the various cores described above (see, e.g., cores 1302A-N in FIGS. 13 and 17), and/or within the vector unit 1210 shown in FIG. 12A. For example, the various source and destination registers may be SIMD registers within the physical register file unit(s) 1158 in FIG. 11B and/or vector registers 1214 in FIG. 12A. The multiplication circuits, adder circuits, accumulation circuits, and other circuitry described below may be integrated within the execution components of the architectures described above including, by way of example and not limitation, the execution unit(s) 1162 in FIG. 11B. It should be noted, however, that the underlying principles of the invention are not limited to these specific architectures.

1. SIMD Data Blending Instructions

In one embodiment, the new blend instructions reuse the multiply and accumulate architecture of the existing SIMD filter. The instruction and implementation are different than how a stand-alone blend function is usually implemented (as described below). The performance improvement of adding such instructions is 3-4 times compared to realizing it with the regular instructions. Because of the hardware reuse the silicon area savings is around 30%.

2. Vertical SIMD FIR Filter Instructions

In one embodiment, existing horizontal filter hardware is reused for vertical filtering instructions. Using existing architectures with SIMD filter units combined with the above blending instructions enables vertical filtering extensions with minimal microarchitectural changes. Performance improvements from adding such instructions is two times for 2D separable filters.

3. SIMD Instructions for Larger Horizontal Filters by Pre-Alignment and Accumulate In one embodiment, hardware is reused and data pre-alignment merged to realize new filter instructions for building larger filters. In this way it is possible to construct larger horizontal filters by a set of instructions in efficient way. This results in an estimated improvement of 2-3× for larger filters.

4. Block Data SIMD Filtering Instructions

Current DSP filtering instructions assume data is organized as horizontal vectors. Modern DSPs can access data in other ways, for example as data blocks. Vertical and horizontal block-based filtering instructions are implemented in one embodiment of the invention. SIMD filtering hardware may also be reused for such operations.

5. Detailed Embodiments

Let the SIMD processing width be denoted by "NWAY." For example NWAY=32 means that 32 operations are performed in parallel. Designing a 3-tap FIR filter instruction with the throughput of NWAY data per clock, will require 3*NWAY multipliers to be used in parallel. The instructions and microarchitecture described thus far support various symmetric and asymmetric FIR filters including configurations with the same hardware (e.g., 5-tap). One embodiment of this architecture is presented below and will serve as a starting point for further discussion.

Figure 19:
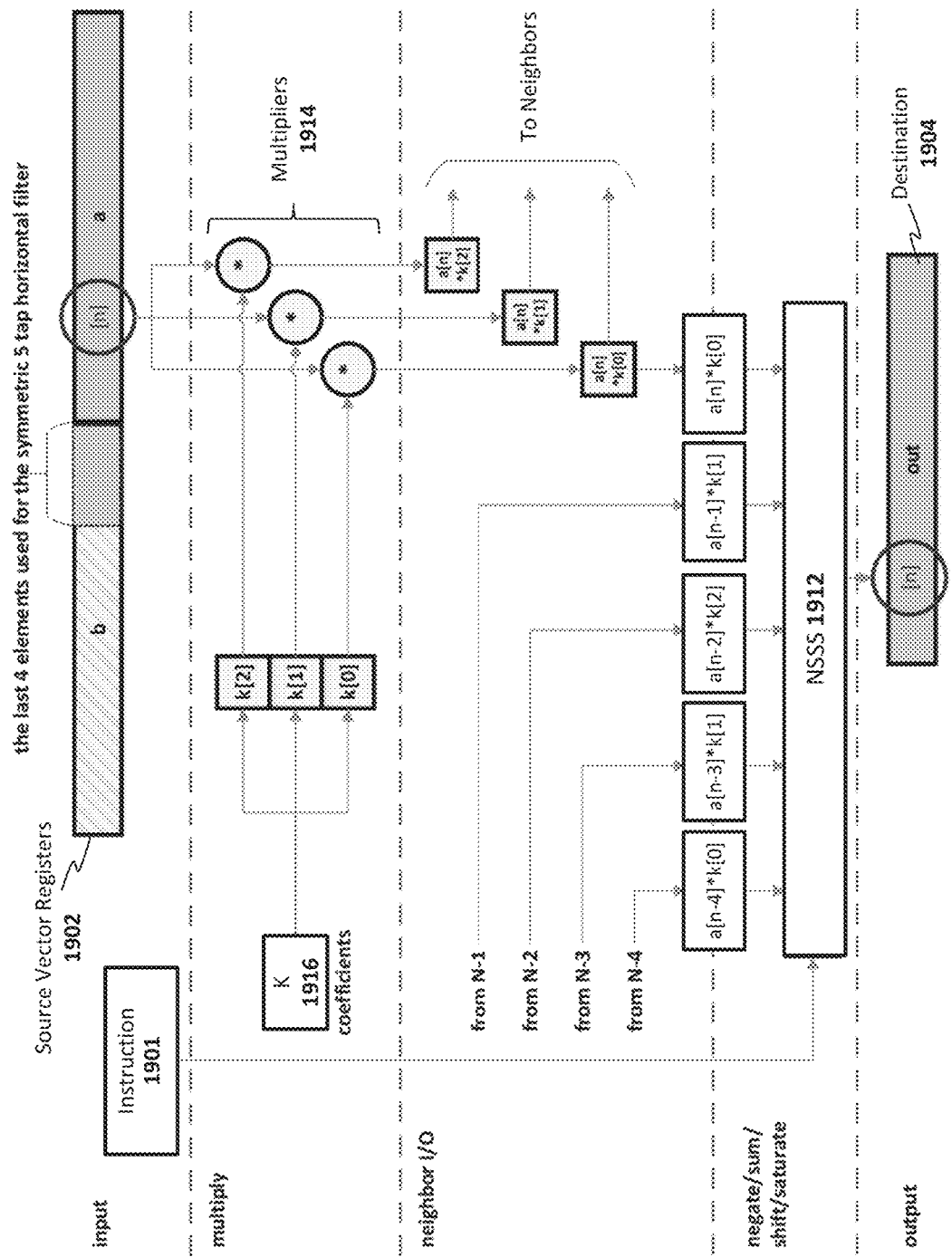
FIG. 19 illustrates an exemplary baseline architecture for a single slice of a SIMD filter unit in accordance with one embodiment of the invention.

FIG. 19 illustrates an exemplary baseline architecture for a single slice of a SIMD filter unit in accordance with one embodiment of the invention. The illustrated implementation includes a plurality of source vector registers 1902 two of which, 'a' and 'b', are shown for storing source operands processed by embodiments of the invention. SIMD filter instructions 1201 which specify the source vector registers 1902 and associated operands are executed using a set of filter coefficients, K 1916. In particular, multipliers 1914 multiply three coefficients K[0], K[1], and K[2], by vector data element a[n]. In this example, a[n] means vector data element 'n' of operand a. Similarly, a[n−1] means data element 'n−1' of a and b[n−1] means data element 'n−1' of operand b. FIG. 19 illustrates a current slice in which data element [n] is generated in the destination operand 1904.

In the illustrated portion of the overall operation, the three multiplications are a[n]*k[0], a[n]*k[1], and a[n]*k[2]. The value a[n]*k[0] is used by negate, sum, shift, and/or saturate circuitry 1912 (hereinafter NSSS circuitry 1912) to generate destination data element [n] in combination with values a[n−4]*k[0], a[n−3]*k[1], a[n−2]*k[2], and a[n−1]*k[1] which are received from other slices and/or prior iterations using the same hardware resources. Assuming that the current iteration is N, these values are provided from N−4 to N−1 as illustrated. The values a[n]*k[1] and a[n]*k[2] from the current slice are passed on to be used in a neighboring iteration (e.g., N+1, N+2, etc), where one or more additional destination data elements is calculated (e.g., [n+1]). The specific operations performed by NSSS circuitry 1912 depends on the particular filter operation being performed, examples of which are provided below.

As used herein, the term "slice" refers to a set of hardware resources such as multipliers 1914 and NSSS circuitry 1912. For example, the resources of a processor may be logically subdivided into slices to concurrently execute one or more instructions. Thus, with sufficient resources, the slices providing the results N−1, N−2, N−3, and N−4 may be operate concurrently and in a similar manner as the illustrated calculation of values a[n]*k[0], a[n]*k[1], and a[n]*k[2]. Similarly, the neighbor slices to which the values a[n]*k[1] and a[n]*k[2] are provided (e.g., N+1, N+2, etc) may operate concurrently with the illustrated hardware. Alternatively, or in addition, the same hardware may perform the illustrated operations across multiple iterations. For example, the results of N−1 to N−4 may be results from a prior iteration using the same hardware resources executing the same or a similar instruction 1901 and the results a[n]*k[1] and a[n]*k[2] may be stored for subsequent iterations of the instruction 1901.

Using the above architecture, various different horizontal filters may be realized including (but not limited to) a 3 tap filter, a 5 tap symmetric filter, and a 5 tap asymmetric filter. The 3 tap filter, for example, may be implemented using:

$$out[n]=a[n-2]k[2]+a[n-1]k[1]+a[n]k[0]$$

The 5 tap symmetric filter may be implemented using:

$$out[n]=a[n-4]k[0]+a[n-3]k[1]+a[n-2]k[2]+a[n-1]k[1]+a[n]k[0]$$

In addition, the 5 tap asymmetric filter may be implemented using:

$$out[n]=-a[n-4]k[0]-a[n-3]k[1]+a[n-1]k[1]+a[n]k[0]$$

In the illustrated embodiment, on the left edge of the vector a, the data is taken from the auxiliary vector b as shown above.

SIMD Data Blending Instructions

The blending operation of two vectors a and b with blending factor c∈[0,1] is defined as:

$$out[n]=a[n]c+b[n](1-c)$$

If a fixed point u1.7 representation is assumed for c than this becomes:

$$out[n]=(a[n]c+b[n](1-c))>>7$$

This formula can be rewritten in more optimal form to use just a single multiplier and this is typical way how blending is implemented:

$$out[n]=((a[n]-b[n])c+b[n])>>7$$

Using regular instructions for the formula above gives total of 4 instructions needed (subtraction, multiplication, addition and shift).

One embodiment of the invention uses the FIR circuitry to implement the blending in a single instruction providing a 4× performance increase. However, the FIR circuitry already has a fixed order of multiply-accumulate-shift operations. Optimal hardware reuse may be achieved in one embodiment by actually implementing the following formulation:

$$out[n]=(a[n]c+b[n]-b[n]c)>>7$$

Figure 20:
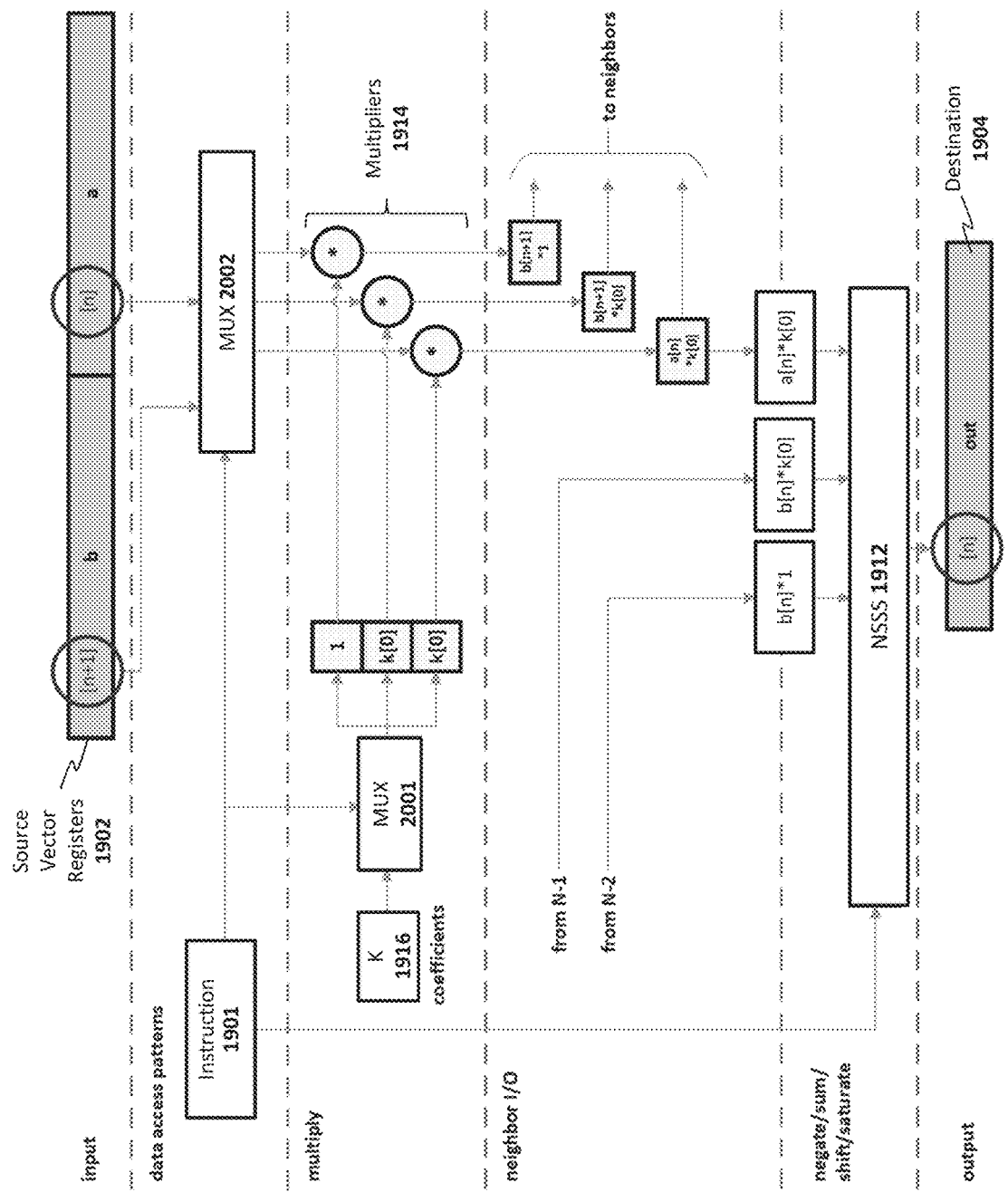
FIG. 20 illustrates one embodiment of the SIMD filter unit slice performing blending operations.

As illustrated in FIG. 20, one embodiment implements the above formulation using additional bits within the instruction 1901 and two multiplexers 2001-2002, thereby reusing the various other components of the functional unit. In the illustrated example, k[0] is used as the blending coefficient c and the instruction bits select the right data elements and the combination at the end after the multiplication stage, as indicated by the control signal provided from the instruction 1901 to NSSS 1912. The multiplexer 2002 selects data element a[n] from the a operand and element b[n+1] from the b operand while multiplexer 2001 selects between the values of 1 and k[0] responsive to the instruction 1901. The multiplexers operate in accordance with the instruction 1901 to provide inputs to the multipliers 1914 which generate the products a[n]*k[0], b[n+1]*k[0], and b[n+1]*1 as illustrated. The product a[n]*k[0] is used by the NSSS circuitry 1912 to generate the resulting data element out[n] using the above equation for out[n] which also requires b[n]*1 and b[n]*k[0] generated from iterations/slices N−1 and N−2 as shown.

In the illustrated micro-architecture, fetching b[n+1] means that this should be taken into account at the borders of the vector. An alternative solution is to place a portion of the multiplexer after the multiplication. Both options are possible, but in the illustrated embodiment just the first option is presented as it can cover all of the necessary changes without changing other parts of the functional unit.

Another blending instruction implemented in one embodiment of the invention blends each data sample from two vectors a and b with a separate blending factor, supplied in the third vector c. The instruction can be realized in the same way by reusing the multiply-accumulate-saturate order of the FIR operation:

$$out[n]=(a[n]c[n]+b[n]-b[n]c[n])>>7$$

Figure 21:
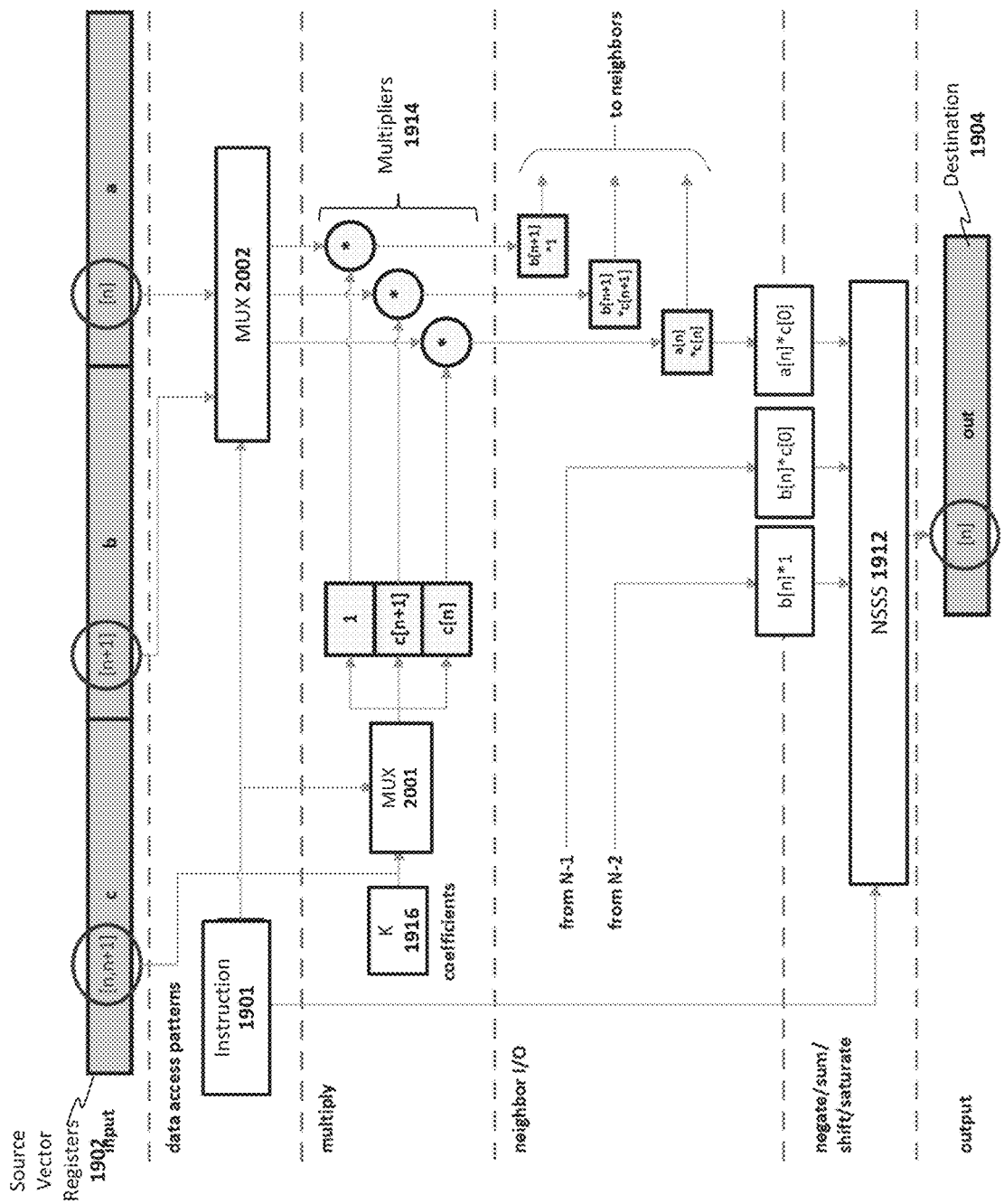
FIG. 21 illustrates an embodiment in which an additional vector is used to supply the coefficient for multiplication.

One implementation is illustrated in FIG. 21, where additional vector c is used to supply a coefficient for multiplication. In particular, the multiplexer 2001 selects data elements c[n] and c[n+1] from operand c and multiplexer 2002 selects data elements b[n+1] and a[n] which generate the products. These values are input to multipliers 1914 which generate the products a[n]*c[n], b[n]*c[n], and b[n]*1. The NSSS circuitry 1912 then performs the above operations on these products to generate the destination data element [n], as shown.

Vertical SIMD FIR Filter Instructions

Having the FIR unit already extended by a third vector input c for the blending operation, one embodiment implements a vertical 3-tap filtering instruction with a minimal hardware changes according to the following equation:

$$out[n]=a[n]k[0]+b[n]k[1]+c[n]k[2]$$

Figure 22:
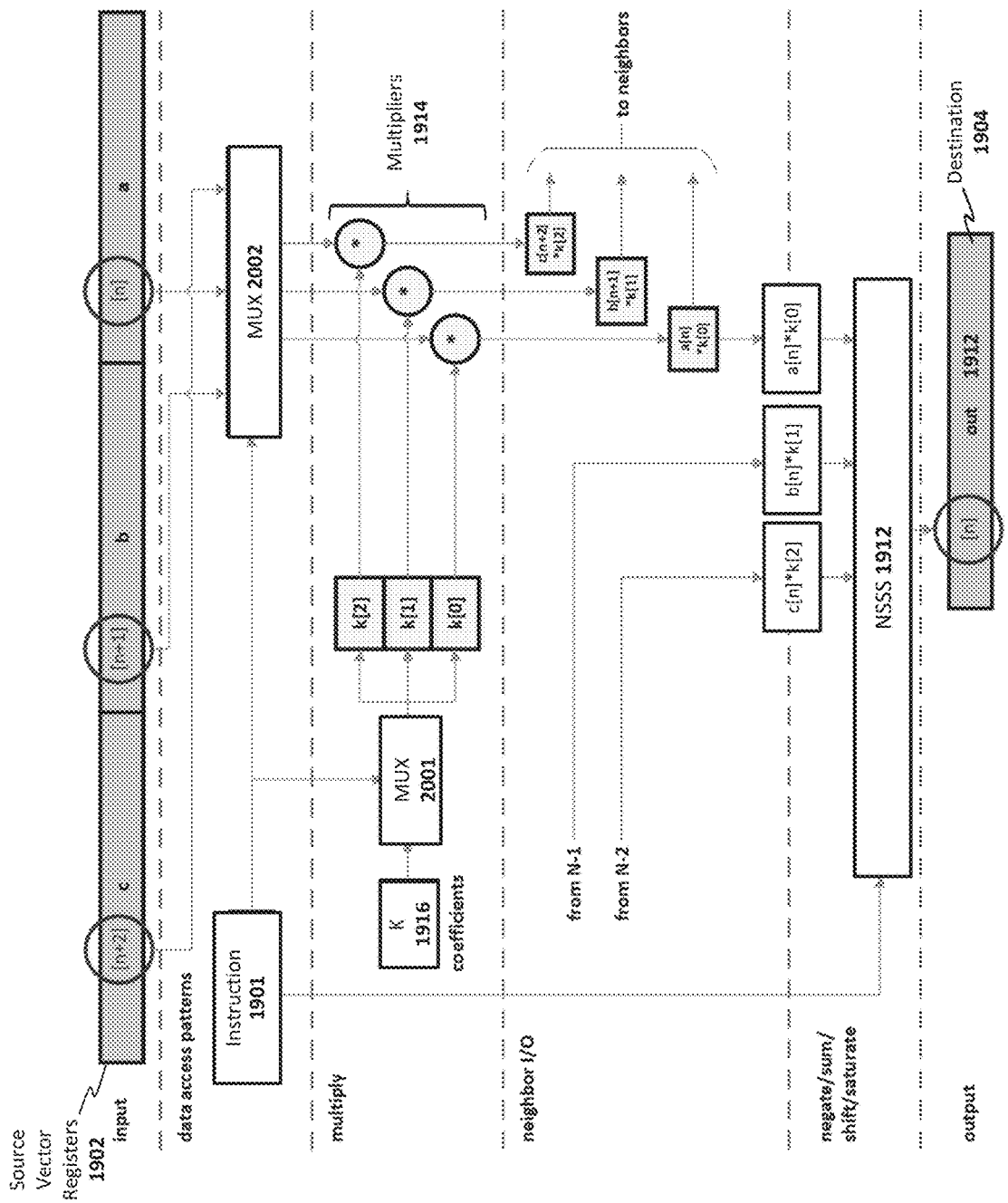
FIG. 22 illustrates one embodiment for executing SIMD FIR filter instructions.

In a typical use case, vectors a, b, and c contain data from 3 sequential image lines. The performance increase realized by this embodiment is 3× as it will replace three multiply-accumulate instructions. One implementation for performing this operation is illustrated in FIG. 22 which shows multiplexer 2001 selecting coefficient values k[0], k[1], and k[2] to be multiplied with data elements a[n], b[n+1], and c[n+2], respectively, as selected by multiplexer 2002. The NSSS 1912 performs the above operation using the resulting product a[n]*k[0] and products b[n]*k[1] and c[n]*k[2] from iteration N−1 and N−2. The products b[n+1] and c[n+2] are passed to neighbors for subsequent iterations.

Once again, fetching c[n+2] and b[n+1] should be properly handled at the borders. The original horizontal filter with 2 inputs will produce non-aligned filter output. If there are 3 vector inputs, those are used in one embodiment to realize a centered horizontal filter on the vector b, where vectors c and a are used as auxiliary data for the left and right border.

SIMD Instructions for Larger Horizontal Filters by Pre-Align and Accumulate

Starting with the 3 tap FIR filter instruction, larger horizontal filters may be constructed with additional operations. For example, it is assumed that there is a vector a and the auxiliary vector b which are used to implement a 5 tap horizontal filter with coefficients k0, k1, k2, k3, k4. The 3 tap FIR instruction can first be used to calculate the 3 tap filter result:

$$out\_3T\_part[n]=a[n-2]k2+a[n-1]k1+a[n]k0$$

For the final result with 5 taps, the last 2 taps of the filter need to be added with the coefficients k3 and k4 as follows:

$$out[n]=out\_3T\_part[n]+a[n-4]k4+a[n-3]k3$$

In one embodiment, this extension is realized using existing multiply-accumulate instructions, which requires two alignment instructions to get the a[n−4] and a[n−3] unaligned vectors, two multiply-accumulate instructions and one addition instruction. Consequently, five additional instructions are executed in total. An alternative embodiment reuses the FIR instruction to replace the two multiply-accumulate instructions with a single instruction and also skips one of the alignments. This would result in three additional instructions.

Figure 23:
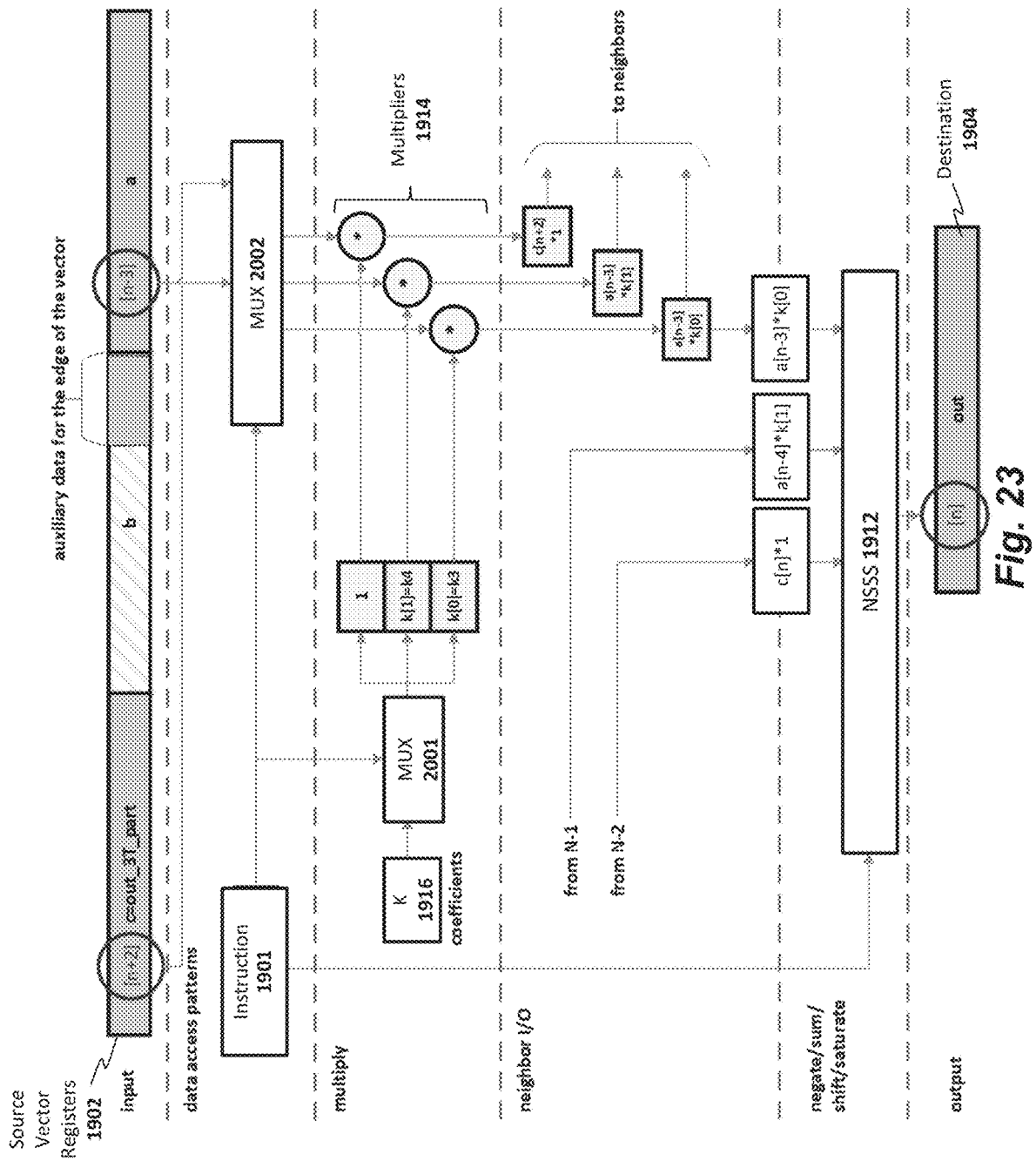
FIG. 23 illustrates one embodiment for implementing horizontal filters using pre-align and accumulate.

In one embodiment, these steps are fused as a single instruction on the illustrated FIR circuitry. This provides a performance increase of 2× as four instructions are replaced by two. As all operations are already part of the FIR circuitry and the operation above has a form similar to a 3-tap filter, the proposed extension is done in one embodiment with minimal hardware changes. For example as shown in FIG. 23, the c=out_3T_part portion of the operation can be used as input for c[n] and c[n+2] and the multiplexer selects k[1]=k4 and k[0]=k5 from the above equation. The values of c[n]*1, a[n−4]*k4, and a[n−3]*k3 are provided as input to NSSS circuitry 1912 which performs the operation out[n]= c[n]*1+a[n−4]k4+a[n−3]k3.

Additional extensions of the above function are to have the partial results as an internal accumulator instead of an external vector c. Another option is to keep the vector a and the auxiliary data b in an internal state and rotate the data elements to generate various data samples access patterns and realize different horizontal filters in multiple accumulation steps.

An additional hardware optimization is to use vector input c for the data a and use the vector input a for the partial sum data. In this way the multiplier connected to the coefficient k[0] will always be connected to the same element of the input vector a across all the previous use cases. As a result, there will be no multiplexing hardware needed for this multiplier.

Block Data SIMD Filtering Instructions

When data is fetched in the form of blocks instead of vectors, the regular FIR instructions cannot be used as the neighborhood data access patterns are different. However, the new hardware architecture proposed in the previous additions that has data access patterns step at the start will allow simple addition of new data access patterns and reuse the compute part of the FIR circuitry.

The following are examples of a horizontal filter on 2D blocks where it will be assumed that vectors are 32 elements wide and the blocks of data are in 4×8 form as shown in FIG. 24. Computing the horizontal filter on this data, the data access pattern to realize would be the same as splitting the filter into 4 separate smaller horizontal filters per row as shown in FIG. 25. Note that in this case, additional multiplier hardware elements may be used to realize the 5 tap symmetric/asymmetric filter versions as there are more data samples that are accessed. No additional multipliers are needed for the 3 tap horizontal filter version.

Figure 26:
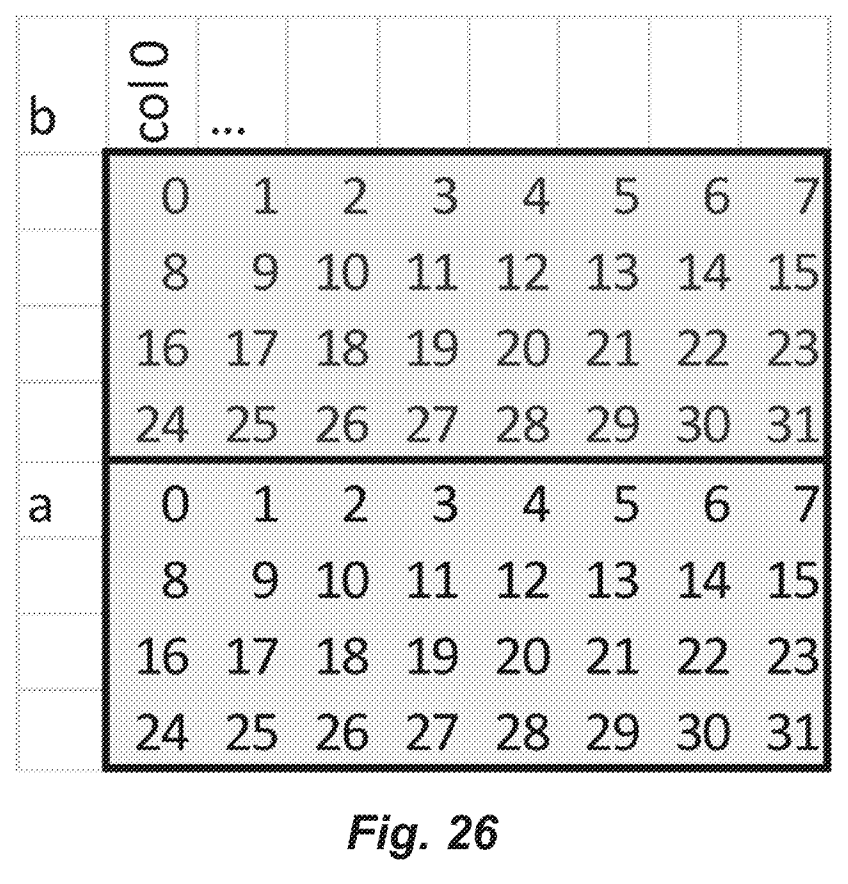
Figure 27:
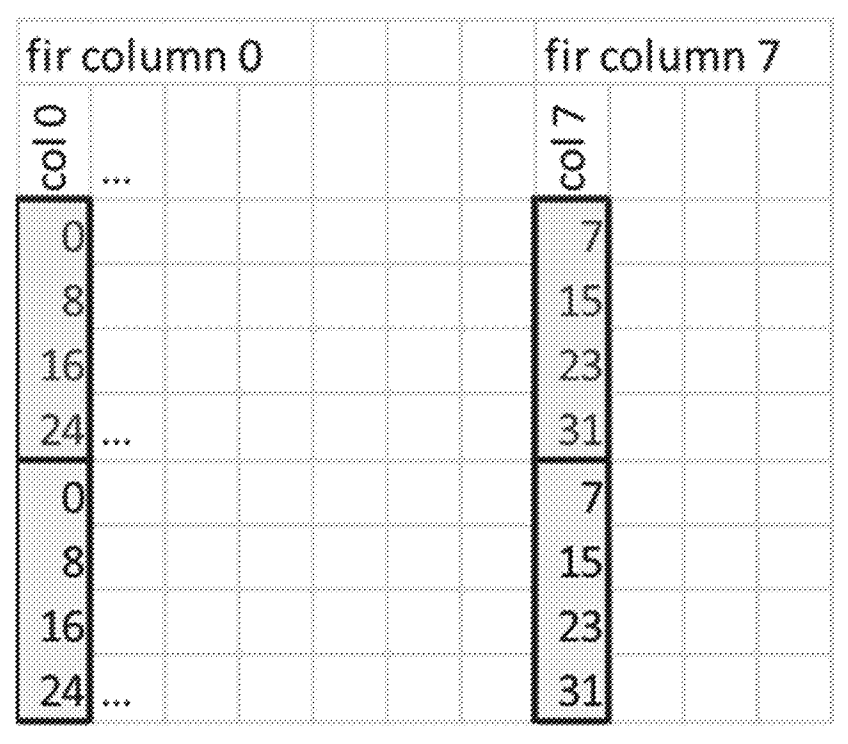

One embodiment also implements a vertical filter with 2D blocks. Once again, in the described embodiment, the blocks are assumed to be 4×8 elements as depicted in FIG. 26. Computing a vertical filter on this data is equivalent to splitting the problem into eight vertical columns for FIR filters as illustrated in FIG. 27. As previously described, additional multiplier elements are needed to support 5 tap symmetric/asymmetric filter variants.

In the foregoing specification, the embodiments of invention have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Components, features, and details described for any of the apparatus may also optionally apply to any of the methods, which in embodiments may be performed by and/or with such apparatus. Any of the processors described herein may be included in any of the systems disclosed herein. In some embodiments, the computer system may include an interconnect, a processor coupled with the interconnect, and a dynamic random access memory (DRAM) coupled with the interconnect. Alternatively, instead of DRAM, other types of volatile memory that don't need to be refreshed may be used, or flash memory may be used.

In the description and claims, the terms "coupled" and/or "connected," along with their derivatives, may have be used. These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, but yet still co-operate or interact with each other. For example, an execution unit may be coupled with a register and/or a decode unit through one or more intervening components. In the figures, arrows are used to show connections and couplings.

The term "and/or" may have been used. As used herein, the term "and/or" means one or the other or both (e.g., A and/or B means A or B or both A and B).

In the description above, specific details have been set forth in order to provide a thorough understanding of the embodiments. However, other embodiments may be practiced without some of these specific details. The scope of the invention is not to be determined by the specific examples provided above, but only by the claims below. In other instances, well-known circuits, structures, devices, and operations have been shown in block diagram form and/or without detail in order to avoid obscuring the understanding of the description. Where considered appropriate, reference numerals, or terminal portions of reference numerals, have been repeated among the figures to indicate corresponding or analogous elements, which may optionally have similar or the same characteristics, unless specified or clearly apparent otherwise.

Certain operations may be performed by hardware components, or may be embodied in machine-executable or circuit-executable instructions, that may be used to cause and/or result in a machine, circuit, or hardware component (e.g., a processor, portion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operative to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operative to cause the machine to perform and/or result in the machine performing one or operations, methods, or techniques disclosed herein.

In some embodiments, the machine-readable medium may include a non-transitory machine-readable storage medium. For example, the non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In some embodiments, the storage medium may include a tangible medium that includes solid matter.

Examples of suitable machines include, but are not limited to, a general-purpose processor, a special-purpose processor, a digital logic circuit, an integrated circuit, or the like. Still other examples of suitable machines include a computer system or other electronic device that includes a processor, a digital logic circuit, or an integrated circuit. Examples of such computer systems or electronic devices include, but are not limited to, desktop computers, laptop computers, notebook computers, tablet computers, netbooks, smartphones, cellular phones, servers, network devices (e.g., routers and switches.), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

Example Embodiments

The following examples pertain to further embodiments. Specifics in the examples may be used anywhere in one or more embodiments.

Example 1 includes a processor or other apparatus comprising: a decode unit to decode a packed N-tap finite impulse response (FIR) filter instruction, the packed N-tap FIR filter instruction to indicate one or more source packed data operands comprising a plurality of packed data elements, at least 3 filter coefficients, and a destination storage location, the plurality of packed data elements comprising data from a signal to be filtered and the plurality of filter coefficients specifying a filter function to be applied; and an execution unit comprising an FIR unit coupled with the decode unit, the FIR unit, in response to the packed N-tap FIR filter instruction being decoded by the decode unit, to perform at least N−1 multiplications to generate at least N−1 products, each of the multiplications comprising one of the filter coefficients multiplied by one of the packed data elements, the execution unit to combine the at least N−1 products in accordance with a specified type of FIR filter being implemented to generate a result packed data element to be stored in the destination storage location.

Example 2 comprises the processor of Example 1 wherein the type of filter being implemented comprises an N-tap symmetric FIR filter and wherein the at least N−1 multiplications comprise N multiplications using N consecutive packed data elements from the one or more source packed data operands to generate N products.

Example 3 comprises the processor of Example 2 wherein the FIR unit is to combine the N products by adding the N products to generate the result packed data element to be stored in the destination storage location.

Example 4 comprises the processor of Example 1 wherein the type of filter being implemented comprises an N-tap asymmetric FIR filter and wherein the at least N−1 multiplications comprise N−1 multiplications using N packed data elements selected from the one or more source packed data operands to generate N−1 products.

Example 5 comprises the processor of Example 4 wherein the FIR unit is to combine the N products by adding one or more products and subtracting one or more products to generate the result packed data element to be stored in the destination storage location.

Example 6 comprises the processor of Example 1 wherein the FIR unit comprises a plurality of multiplication circuits to perform the multiplication operations and a plurality of add/subtract circuits to perform additions and/or subtractions of the at least N−1 products in accordance with a specified type of FIR filter.

Example 7 comprises the processor of Example 1 wherein the decode unit is to further decode a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and the execution unit to utilize at least a portion of the FIR unit to perform a blending operation to blend the second plurality of packed data elements and third plurality of packed data elements in accordance with the specified blending factor.

Example 8 comprises the processor of Example 7 wherein the portion of the FIR unit comprises a first multiplexer to select one or more blending factors and a second multiplexer to select one or more of the second and third plurality of data elements.

Example 9 comprises the processor of Example 8 wherein the portion of the FIR unit further comprises:

a plurality of multipliers to multiply a first blending factor with a first data element of the second plurality of data elements to generate a first product and to multiply a second blending factor with a second data element of the third plurality of data elements to generate a second product.

Example 10 comprises the processor of Example 9 wherein the first and second blending factors are provided with the packed data blending instruction as a third operand.

Example 11 comprises the processor of Example 9 wherein the FIR unit is to execute one or more additional operations using the first product and second product to generate a blended data element to be stored in a destination register, the one or more additional operations including one or more of:

adding and/or subtracting the first product and the second product, alone or in addition to one or more other values to generate a first temporary result;

shifting the first temporary result by a specified amount to generate a second temporary result; and saturating the second temporary result, if required, to generate the blended data element.

Example 12 comprises the processor of Example 1 wherein the N-tap FIR filter instruction comprises a vertical N-tap filtering instruction to perform filtering operations on columns of data, at least some of which is provided in a first operand and a second operand, the filtering to be performed in accordance with the plurality of filter coefficients specifying a vertical N-tap filtering function.

Example 13 comprises the processor of Example 12 wherein the filter coefficients are to be stored in a third operand of the vertical N-tap filtering instruction.

Example 14 comprises the processor of Example 1 wherein the N-tap FIR filter instruction comprises a horizontal N-tap filtering instruction to perform filtering operations on rows of data, at least some of which is provided in a first operand and a second operand, the filtering to be performed in accordance with the plurality of filter coefficients specifying a horizontal N-tap filtering function.

Example 15 comprises the processor of Example 14 wherein the filter coefficients are to be stored in a third operand of the horizontal N-tap filtering instruction.

Example 16. A method comprising:

decoding a packed N-tap finite impulse response (FIR) filter instruction, the packed N-tap FIR filter instruction indicating one or more source packed data operands comprising a plurality of packed data elements, at least 3 filter coefficients, and a destination storage location, the plurality of packed data elements comprising data from a signal to be filtered and the plurality of filter coefficients specifying a filter function to be applied; and executing at least N−1 multiplications on an FIR unit of a processor to generate at least N−1 products, each of the multiplications comprising one of the filter coefficients multiplied by one of the packed data elements;

combining the at least N−1 products by the FIR unit in accordance with a specified type of FIR filter being implemented to generate a result packed data element to be stored in the destination storage location.

Example 17 comprises the method of Example 16 wherein the type of filter being implemented comprises an N-tap symmetric FIR filter and wherein the at least N−1 multiplications comprise N multiplications using N consecutive packed data elements from the one or more source packed data operands to generate N products.

Example 18 comprises the method of Example 17 wherein the FIR unit is to combine the N products by adding the N products to generate the result packed data element to be stored in the destination storage location.

Example 19 comprises the method of Example 16 wherein the type of filter being implemented comprises an N-tap asymmetric FIR filter and wherein the at least N−1 multiplications comprise N−1 multiplications using N packed data elements selected from the one or more source packed data operands to generate N−1 products.

Example 20 comprises the method of Example 19 wherein the FIR unit is to combine the N products by adding one or more products and subtracting one or more products to generate the result packed data element to be stored in the destination storage location.

Example 21 comprises the method of Example 16 wherein the FIR unit comprises a plurality of multiplication circuits to perform the multiplication operations and a plurality of add/subtract circuits to perform additions and/or subtractions of the at least N−1 products in accordance with a specified type of FIR filter.

Example 22 comprises the method of Example 16 further comprising:

decoding a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and utilizing at least a portion of the FIR unit to perform a blending operation to blend the second plurality of packed data elements and third plurality of packed data elements in accordance with the specified blending factor.

Example 23 comprises the method of Example 22 wherein the portion of the FIR unit comprises a first multiplexer to select one or more blending factors and a second multiplexer to select one or more of the second and third plurality of data elements.

Example 24 comprises the method of Example 23 wherein the portion of the FIR unit further comprises:

a plurality of multipliers to multiply a first blending factor with a first data element of the second plurality of data elements to generate a first product and to multiply a second blending factor with a second data element of the third plurality of data elements to generate a second product.

Example 25 comprises the method of Example 24 wherein the first and second blending factors are provided with the packed data blending instruction as a third operand.

Example 26 comprises the method of Example 24 wherein the FIR unit is to execute one or more additional operations using the first product and second product to generate a blended data element to be stored in a destination register, the one or more additional operations including one or more of:

adding and/or subtracting the first product and the second product, alone or in addition to one or more other values to generate a first temporary result;

shifting the first temporary result by a specified amount to generate a second temporary result; and saturating the second temporary result, if required, to generate the blended data element.

Example 27 comprises the method of Example 16 wherein the N-tap FIR filter instruction comprises a vertical N-tap filtering instruction to perform filtering operations on columns of data, at least some of which is provided in a first operand and a second operand, the filtering to be performed in accordance with the plurality of filter coefficients specifying a vertical N-tap filtering function.

Example 28 comprises the method of Example 27 wherein the filter coefficients are to be stored in a third operand of the vertical N-tap filtering instruction.

Example 29 comprises the method of Example 16 wherein the N-tap FIR filter instruction comprises a horizontal N-tap filtering instruction to perform filtering operations on rows of data, at least some of which is provided in a first operand and a second operand, the filtering to be performed in accordance with the plurality of filter coefficients specifying a horizontal N-tap filtering function.

Example 30 comprises the method of Example 29 wherein the filter coefficients are to be stored in a third operand of the horizontal N-tap filtering instruction.

Example 31. A machine-readable medium having program code stored thereon which, when executed by a processor, causes the processor to perform the operations of:
 decoding a packed N-tap finite impulse response (FIR) filter instruction, the packed N-tap FIR filter instruction indicating one or more source packed data operands comprising a plurality of packed data elements, at least 3 filter coefficients, and a destination storage location, the plurality of packed data elements comprising data from a signal to be filtered and the plurality of filter coefficients specifying a filter function to be applied; and
 executing at least N−1 multiplications on an FIR unit of a processor to generate at least N−1 products, each of the multiplications comprising one of the filter coefficients multiplied by one of the packed data elements;
 combining the at least N−1 products by the FIR unit in accordance with a specified type of FIR filter being implemented to generate a result packed data element to be stored in the destination storage location.

Example 32 comprises the machine-readable medium of Example 31 wherein the type of filter being implemented comprises an N-tap symmetric FIR filter and wherein the at least N−1 multiplications comprise N multiplications using N consecutive packed data elements from the one or more source packed data operands to generate N products.

Example 33 comprises the machine-readable medium of Example 32 wherein the FIR unit is to combine the N products by adding the N products to generate the result packed data element to be stored in the destination storage location.

Example 34 comprises the machine-readable medium of Example 31 wherein the type of filter being implemented comprises an N-tap asymmetric FIR filter and wherein the at least N−1 multiplications comprise N−1 multiplications using N packed data elements selected from the one or more source packed data operands to generate N−1 products.

Example 35 comprises the machine-readable medium of Example 34 wherein the FIR unit is to combine the N products by adding one or more products and subtracting one or more products to generate the result packed data element to be stored in the destination storage location.

Example 36 comprises the machine-readable medium of Example 31 wherein the FIR unit comprises a plurality of multiplication circuits to perform the multiplication operations and a plurality of add/subtract circuits to perform additions and/or subtractions of the at least N−1 products in accordance with a specified type of FIR filter.

Example 37 comprises the machine-readable medium of Example 31 wherein the decode unit is to further decode a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and
 utilizing at least a portion of the FIR unit to perform a blending operation to blend the second plurality of packed data elements and third plurality of packed data elements in accordance with the specified blending factor.

Example 38 comprises the machine-readable medium of Example 37 wherein the portion of the FIR unit comprises a first multiplexer to select one or more blending factors and a second multiplexer to select one or more of the second and third plurality of data elements.

Example 39 comprises the machine-readable medium of Example 38 wherein the portion of the FIR unit further comprises:
 a plurality of multipliers to multiply a first blending factor with a first data element of the second plurality of data elements to generate a first product and to multiply a second blending factor with a second data element of the third plurality of data elements to generate a second product.

Example 40 comprises the machine-readable medium of Example 39 wherein the first and second blending factors are provided with the packed data blending instruction as a third operand.

Example 41 comprises the machine-readable medium of Example 39 wherein the FIR unit is to execute one or more additional operations using the first product and second product to generate a blended data element to be stored in a destination register, the one or more additional operations including one or more of:
 adding and/or subtracting the first product and the second product, alone or in addition to one or more other values to generate a first temporary result;
 shifting the first temporary result by a specified amount to generate a second temporary result; and
 saturating the second temporary result, if required, to generate the blended data element.

Example 42 comprises the machine-readable medium of Example 31 wherein the N-tap FIR filter instruction comprises a vertical N-tap filtering instruction to perform filtering operations on columns of data, at least some of which is provided in a first operand and a second operand, the filtering to be performed in accordance with the plurality of filter coefficients specifying a vertical N-tap filtering function.

Example 43 comprises the machine-readable medium of Example 42 wherein the filter coefficients are to be stored in a third operand of the vertical N-tap filtering instruction.

Example 44 comprises the machine-readable medium of Example 31 wherein the N-tap FIR filter instruction comprises a horizontal N-tap filtering instruction to perform filtering operations on rows of data, at least some of which is provided in a first operand and a second operand, the filtering to be performed in accordance with the plurality of filter coefficients specifying a horizontal N-tap filtering function.

Example 45 comprises the machine-readable medium of Example 44 wherein the filter coefficients are to be stored in a third operand of the horizontal N-tap filtering instruction.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A processor comprising:
    a decoder to decode a packed N-tap finite impulse response (FIR) filter instruction, the packed N-tap FIR filter instruction to indicate one or more source packed data operands comprising a first plurality of packed data elements and a second plurality of packed data elements that has at least N−1 data elements, a plurality of filter coefficients comprising at least 3 filter coefficients, and a destination storage location, the first and second plurality of packed data elements comprising data from a signal to be filtered and the plurality of filter coefficients; and
    an execution circuitry coupled with the decoder, in response to the packed N-tap FIR filter instruction being decoded by the decoder, to perform, using the second plurality of packed data elements, at least N−1 multiplications to generate at least N−1 products, each of the multiplications comprising one of the filter coefficients multiplied by one of the packed data elements, and to combine the at least N−1 products in accordance with a type of FIR filter being implemented to generate a result packed data element to be stored in the destination storage location, wherein the type of FIR filter being implemented comprises an N-tap asymmetric FIR filter and wherein the at least N−1 multiplications comprise N−1 multiplications using N packed data elements selected from the one or more source packed data operands to generate N−1 products.

2. The processor of claim 1 wherein the type of FIR filter being implemented comprises an N-tap symmetric FIR filter and wherein the at least N−1 multiplications comprise N multiplications using N consecutive packed data elements from the one or more source packed data operands to generate N products.

3. The processor of claim 2 wherein the execution circuitry is to combine the N products by adding the N products to generate the result packed data element to be stored in the destination storage location.

4. The processor of claim 1 wherein the execution circuitry is to combine the N products by adding one or more products and subtracting one or more products to generate the result packed data element to be stored in the destination storage location.

5. The processor of claim 1 wherein the execution circuitry comprises a plurality of multiplication circuits to perform the multiplication operations and a plurality of add/subtract circuits to perform additions and/or subtractions of the at least N−1 products in accordance with the type of FIR filter.

6. The processor of claim 1 wherein the decoder is to further decode a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and the execution circuitry to perform a blending operation to blend the second plurality of packed data elements and third plurality of packed data elements in accordance with the specified blending factor.

7. The processor of claim 6 wherein the execution circuitry comprises a first multiplexer to select one or more blending factors and a second multiplexer to select one or more of the second and third plurality of data elements.

8. The processor of claim 7 wherein the execution circuitry further comprises:
    a plurality of multipliers to multiply a first blending factor with a first data element of the second plurality of data elements to generate a first product and to multiply a second blending factor with a second data element of the third plurality of data elements to generate a second product.

9. The processor of claim 8 wherein the first and second blending factors are provided with the packed data blending instruction as a third operand.

10. The processor of claim 8 wherein the execution circuitry is to execute one or more additional operations using the first product and second product to generate a blended data element to be stored in a destination register, the one or more additional operations including one or more of:

adding and/or subtracting the first product and the second product, alone or in addition to one or more other values to generate a first temporary result;

shifting the first temporary result by a specified amount to generate a second temporary result; and saturating the second temporary result, if required, to generate the blended data element.

11. The processor of claim 1 wherein the N-tap FIR filter instruction comprises a vertical N-tap filtering instruction to perform filtering operations on columns of data, at least some of which is provided in the one or more source packed data operands, the filtering to be performed in accordance with the plurality of filter coefficients specifying a vertical N-tap filtering function.

12. The processor of claim 11 wherein the vertical N-tap filtering instruction specifies the plurality of filter coefficients to perform the filtering operations on the columns of data.

13. The processor of claim 1 wherein the N-tap FIR filter instruction comprises a horizontal N-tap filtering instruction to perform filtering operations on rows of data, at least some of which is provided in the one or more source packed data operands, the filtering to be performed in accordance with the plurality of filter coefficients specifying a horizontal N-tap filtering function.

14. The processor of claim 13 wherein the horizontal N-tap filtering instruction specifies the plurality of filter coefficients to perform the filtering operations on the rows of data.

15. A method comprising:

decoding a packed N-tap finite impulse response (FIR) filter instruction, the packed N-tap FIR filter instruction indicating one or more source packed data operands comprising a plurality of packed data elements, a plurality of filter coefficients comprising at least 3 filter coefficients, and a destination storage location, the plurality of packed data elements comprising data from a signal to be filtered and the plurality of filter coefficients;

executing at least N−1 multiplications on an execution circuitry of a processor to generate at least N−1 products, each of the multiplications comprising one of the filter coefficients multiplied by one of the packed data elements; and combining the at least N−1 products by the execution circuitry in accordance with a type of FIR filter being implemented to generate a result packed data element to be stored in the destination storage location, wherein the type of FIR filter being implemented comprises an N-tap asymmetric FIR filter and wherein the at least N−1 multiplications comprise N−1 multiplications using N packed data elements selected from the one or more source packed data operands to generate N−1 products.

16. The method of claim 15 wherein the type of FIR filter being implemented comprises an N-tap symmetric FIR filter and wherein the at least N−1 multiplications comprise N multiplications using N consecutive packed data elements from the one or more source packed data operands to generate N products.

17. The method of claim 16 wherein the execution circuitry is to combine the N products by adding the N products to generate the result packed data element to be stored in the destination storage location.

18. The method of claim 15 wherein the execution circuitry is to combine the N products by adding one or more products and subtracting one or more products to generate the result packed data element to be stored in the destination storage location.

19. The method of claim 15 wherein the execution circuitry comprises a plurality of multiplication circuits to perform the multiplication operations and a plurality of add/subtract circuits to perform additions and/or subtractions of the at least N−1 products in accordance with the type of FIR filter.

20. The method of claim 15 further comprising:

decoding a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and utilizing at least a portion of the execution circuitry to perform a blending operation to blend the second plurality of packed data elements and third plurality of packed data elements in accordance with the specified blending factor.

21. The method of claim 20 wherein the portion of the execution circuitry comprises a first multiplexer to select one or more blending factors and a second multiplexer to select one or more of the second and third plurality of data elements.

22. The method of claim 21 wherein the portion of the execution circuitry further comprises:

a plurality of multipliers to multiply a first blending factor with a first data element of the second plurality of data elements to generate a first product and to multiply a second blending factor with a second data element of the third plurality of data elements to generate a second product.

23. The method of claim 22 wherein the first and second blending factors are provided with the packed data blending instruction as a third operand.

24. The method of claim 22 wherein the execution circuitry is to execute one or more additional operations using the first product and second product to generate a blended data element to be stored in a destination register, the one or more additional operations including one or more of:

adding and/or subtracting the first product and the second product, alone or in addition to one or more other values to generate a first temporary result;

shifting the first temporary result by a specified amount to generate a second temporary result; and saturating the second temporary result, if required, to generate the blended data element.

25. The method of claim 15 wherein the N-tap FIR filter instruction comprises a vertical N-tap filtering instruction to perform filtering operations on columns of data, at least some of which is provided in the one or more source packed data operands, the filtering to be performed in accordance with the plurality of filter coefficients specifying a vertical N-tap filtering function.

26. The method of claim 25 wherein the vertical N-tap filtering instruction specifies the plurality of filter coefficients to perform the filtering operations on the columns of data.

27. The method of claim 15 wherein the N-tap FIR filter instruction comprises a horizontal N-tap filtering instruction to perform filtering operations on rows of data, at least some of which is provided in the one or more source packed data operands, the filtering to be performed in accordance with the plurality of filter coefficients specifying a horizontal N-tap filtering function.

28. The method of claim 27 wherein the horizontal N-tap filtering instruction specifies the plurality of filter coefficients to perform the filtering operations on the rows of data.

29. A non-transitory machine-readable medium having program code stored thereon which, when executed by a processor, causes the processor to perform the operations of:
    decoding a packed N-tap finite impulse response (FIR) filter instruction, the packed N-tap FIR filter instruction indicating one or more source packed data operands comprising a plurality of packed data elements, a plurality of filter coefficients comprising at least 3 filter coefficients, and a destination storage location, the plurality of packed data elements comprising data from a signal to be filtered and the plurality of filter coefficients; and
    executing at least N−1 multiplications on an execution circuitry of a processor to generate at least N−1 products, each of the multiplications comprising one of the filter coefficients multiplied by one of the packed data elements;
    combining the at least N−1 products by the execution circuitry in accordance with a type of FIR filter being implemented to generate a result packed data element to be stored in the destination storage location, wherein the type of FIR filter being implemented comprises an N-tap asymmetric FIR filter and wherein the at least N−1 multiplications comprise N−1 multiplications using N packed data elements selected from the one or more source packed data operands to generate N−1 products.

30. The non-transitory machine-readable medium of claim 29 wherein the type of FIR filter being implemented comprises an N-tap symmetric FIR filter and wherein the at least N−1 multiplications comprise N multiplications using N consecutive packed data elements from the one or more source packed data operands to generate N products.

31. The non-transitory machine-readable medium of claim 30 wherein the execution circuitry is to combine the N products by adding the N products to generate the result packed data element to be stored in the destination storage location.

32. The non-transitory machine-readable medium of claim 29 wherein the execution circuitry is to combine the N products by adding one or more products and subtracting one or more products to generate the result packed data element to be stored in the destination storage location.

33. The non-transitory machine-readable medium of claim 29 wherein the execution circuitry comprises a plurality of multiplication circuits to perform the multiplication operations and a plurality of add/subtract circuits to perform additions and/or subtractions of the at least N−1 products in accordance with the type of FIR filter.

34. The non-transitory machine-readable medium of claim 29 wherein the operations are to further perform:
    decoding a packed data blending instruction, the packed data blending instruction to indicate a second packed source data operand comprising a second plurality of packed data elements and a third packed source data operand comprising a third plurality of data elements to be blended with the second plurality of data elements in accordance with a specified blending factor; and
    utilizing at least a portion of the execution circuitry to perform a blending operation to blend the second plurality of packed data elements and third plurality of packed data elements in accordance with the specified blending factor.

35. The non-transitory machine-readable medium of claim 34 wherein the portion of the execution circuitry comprises a first multiplexer to select one or more blending factors and a second multiplexer to select one or more of the second and third plurality of data elements.

36. The non-transitory machine-readable medium of claim 35 wherein the portion of the execution circuitry further comprises:
    a plurality of multipliers to multiply a first blending factor with a first data element of the second plurality of data elements to generate a first product and to multiply a second blending factor with a second data element of the third plurality of data elements to generate a second product.

37. The non-transitory machine-readable medium of claim 36 wherein the first and second blending factors are provided with the packed data blending instruction as a third operand.

38. The non-transitory machine-readable medium of claim 36 wherein the execution circuitry is to execute one or more additional operations using the first product and second product to generate a blended data element to be stored in a destination register, the one or more additional operations including one or more of:
    adding and/or subtracting the first product and the second product, alone or in addition to one or more other values to generate a first temporary result;
    shifting the first temporary result by a specified amount to generate a second temporary result; and
    saturating the second temporary result, if required, to generate the blended data element.

39. The non-transitory machine-readable medium of claim 29 wherein the N-tap FIR filter instruction comprises a vertical N-tap filtering instruction to perform filtering operations on columns of data, at least some of which is provided in the one or more source packed data operands, the filtering to be performed in accordance with the plurality of filter coefficients specifying a vertical N-tap filtering function.

40. The non-transitory machine-readable medium of claim 39 wherein the vertical N-tap filtering instruction specifies the plurality of filter coefficients to perform the filtering operations on the columns of data.

41. The non-transitory machine-readable medium of claim 29 wherein the N-tap FIR filter instruction comprises a horizontal N-tap filtering instruction to perform filtering operations on rows of data, at least some of which is provided in the one or more source packed data operands, the filtering to be performed in accordance with the plurality of filter coefficients specifying a horizontal N-tap filtering function.

42. The non-transitory machine-readable medium of claim 41 wherein the horizontal N-tap filtering instruction specifies the plurality of filter coefficients to perform the filtering operations on the rows of data.

* * * * *